(12) United States Patent
Yoshinaga et al.

(10) Patent No.: US 11,131,885 B2
(45) Date of Patent: Sep. 28, 2021

(54) LIGHT EMITTNG DEVICE

(71) Applicant: NICHIA CORPORATION, Anan (JP)

(72) Inventors: Satoshi Yoshinaga, Yoshinogawa (JP); Kana Sakamoto, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/529,991

(22) Filed: Aug. 2, 2019

(65) Prior Publication Data
US 2020/0041845 A1 Feb. 6, 2020

(30) Foreign Application Priority Data

Aug. 3, 2018 (JP) .............................. JP2018-146393

(51) Int. Cl.
*G02F 1/13357* (2006.01)
*H01L 25/075* (2006.01)
(Continued)

(52) U.S. Cl.
CPC .. *G02F 1/133611* (2013.01); *G02F 1/133603* (2013.01); *G02F 1/133606* (2013.01); *H01L 25/0753* (2013.01); *H01L 33/483* (2013.01); *H01L 33/62* (2013.01); *H01L 33/644* (2013.01); *H05K 1/189* (2013.01); (Continued)

(58) Field of Classification Search
CPC ......... G02F 1/133611; G02F 1/133603; G02F 1/133606; G02F 1/133607; G02F 1/133612; G02F 1/133628; G02F 1/133608; G02F 1/133385; H01L 25/0753; H01L 33/62; H01L 33/483; H01L 33/644; H01L 27/156; H01L 33/642; H05K 1/189; H05K 2201/10106; H05K 2201/10136;
(Continued)

(56) References Cited

U.S. PATENT DOCUMENTS

| 2006/0138441 A1 | 6/2006 | Kromotis et al. |
| 2007/0019394 A1* | 1/2007 | Park ..................... G02B 6/0021 362/23.18 |

(Continued)

FOREIGN PATENT DOCUMENTS

| JP | 2006501657 A | 1/2006 |
| JP | 200735742 A | 11/2007 |

(Continued)

*Primary Examiner* — Charles S Chang
(74) *Attorney, Agent, or Firm* — Hunton Andrews Kurth LLP

(57) ABSTRACT

A light emitting device according to the present invention includes a flexible wiring board that electrically connects light emitting modules to each other. The light emitting modules include anode-side and cathode-side terminals that are arranged on their back surface and are connected to light emitting elements, which are included in their light emitting module and connected to each other in series or in parallel, in order to supply currents to light emitting elements. The wiring board has a comb shape that includes a number of comb-tooth portions extending in row or column direction of the matrix arrangement of the light emitting modules. The comb-tooth portions include an electrically-conductive pattern. The anode-side and cathode-side terminals of light emitting modules are connected to the electrically-conductive pattern of the comb-tooth portions of the wiring board.

18 Claims, 17 Drawing Sheets

(51) Int. Cl.
*H01L 33/62* (2010.01)
*H01L 33/48* (2010.01)
*G02F 1/1335* (2006.01)
*H01L 33/64* (2010.01)
*H05K 1/18* (2006.01)

(52) U.S. Cl.
CPC .. *G02F 1/133607* (2021.01); *G02F 1/133608* (2013.01); *G02F 1/133612* (2021.01); *G02F 1/133628* (2021.01); *H05K 2201/10106* (2013.01)

(58) Field of Classification Search
CPC ....... H05K 2201/052; H05K 2201/053; H05K 2201/0145
USPC .................................................. 349/149–152
See application file for complete search history.

(56) References Cited

U.S. PATENT DOCUMENTS

| 2008/0143916 | A1* | 6/2008 | Fujino | G02F 1/133611 349/58 |
| 2010/0265711 | A1* | 10/2010 | Lee | H05K 3/0052 362/249.06 |
| 2012/0069584 | A1 | 3/2012 | Kawabe et al. | |
| 2016/0282669 | A1* | 9/2016 | Lee | G02F 1/133605 |

FOREIGN PATENT DOCUMENTS

| JP | 2009044099 A | 2/2009 |
| JP | 2010278071 A | 12/2010 |
| JP | 2012069673 A | 4/2012 |
| JP | 2013065427 A | 4/2013 |
| JP | 201763081 A | 3/2017 |

* cited by examiner

LIGHT EMITTNG DEVICE

CROSS-REFERENCE TO RELATED APPLICATIONS

The present application claims priority under 35 U.S.C. § 119 to Japanese Patent Application No. 2018-146,393, filed on Aug. 3, 2018, the content of which is incorporated herein by reference in its entirety.

BACKGROUND OF THE INVENTION

1. Field of the Invention

The present invention relates to a light emitting device, a light emitting module, and a method for manufacturing the light emitting device.

2. Description of the Related Art

Light emitting devices that include light emitting elements such as light emitting diodes (LEDs) are widely used as backlights for liquid crystal displays, and light sources in various types of displays or the like (see Laid-Open Patent Publications Nos. JP 2012-069,673 A, and JP 2013-065,427 A, for example).

In the case where such light emitting elements are used for a backlight of large liquid crystal displays, a number of light emitting elements are mounted in a matrix arrangement in a number of light emitting modules which are arranged in a matrix arrangement to provide a large light emitting screen. Some types of such light emitting modules are known which are electrically connected to each other by connectors.

However, if light emitting modules are designed to be arranged without a gap between them by bringing their side surfaces into contact with each other, it is difficult to provide space for accommodating the connecters. For this reason, these connecters will reduce freedom of design.

It is an object to provide a light emitting device and a light emitting module for easy connections between one light emitting module and another light emitting module, and a method for manufacturing the light emitting device.

SUMMARY OF THE INVENTION

A light emitting device according to one aspect of the present invention includes a plurality of light emitting modules, a frame, and a flexible wiring board. The plurality of light emitting modules include a plurality of light emitting elements. The frame holds the plurality of light emitting modules on a common plane to provide a light emitting screen. The wiring board electrically connects the plurality of light emitting modules to each other. The light emitting modules include anode-side and cathode-side terminals that are arranged on their back surface. The anode-side and cathode-side terminals are connected to the plurality of light emitting elements, which are included in their light emitting module and are connected to each other in series or in parallel, in order to supply currents to the plurality of light emitting elements. The wiring board has a comb shape that includes a plurality of comb-tooth portions extending in the row or column direction of the matrix arrangement of the plurality of light emitting modules. The comb-tooth portions include an electrically-conductive pattern. The anode-side and cathode-side terminals of the plurality of light emitting modules are connected to the electrically-conductive pattern of the comb-tooth portions of the wiring board.

A light emitting apparatus according to another aspect of the present invention includes a plurality of light emitting modules, a frame, and a flexible wiring board. The plurality of light emitting modules include a plurality of light emitting elements. The frame holds the plurality of light emitting modules in a matrix arrangement on a common plane to provide a light emitting screen. The wiring board includes a plurality of slit parts extending in the row or column direction of the matrix arrangement of the plurality of light emitting modules. The wiring board electrically connects the plurality of light emitting modules to each other. The heat-dissipating plates or parts of a heat-dissipating plate are arranged in the plurality of slit parts.

In the light emitting device according to the one aspect of the present invention, the light emitting modules can be easily electrically connected to each other by the comb-shaped wiring board when arranged in a matrix arrangement.

In addition, in the light emitting device according to another aspect of the present invention, heat can be efficiently radiated by the heat-dissipating plates or parts of a heat-dissipating plate arranged in the slit parts of the wiring board from the light emitting modules connected to each other along the wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF EMBODIMENTS

Figure 1:
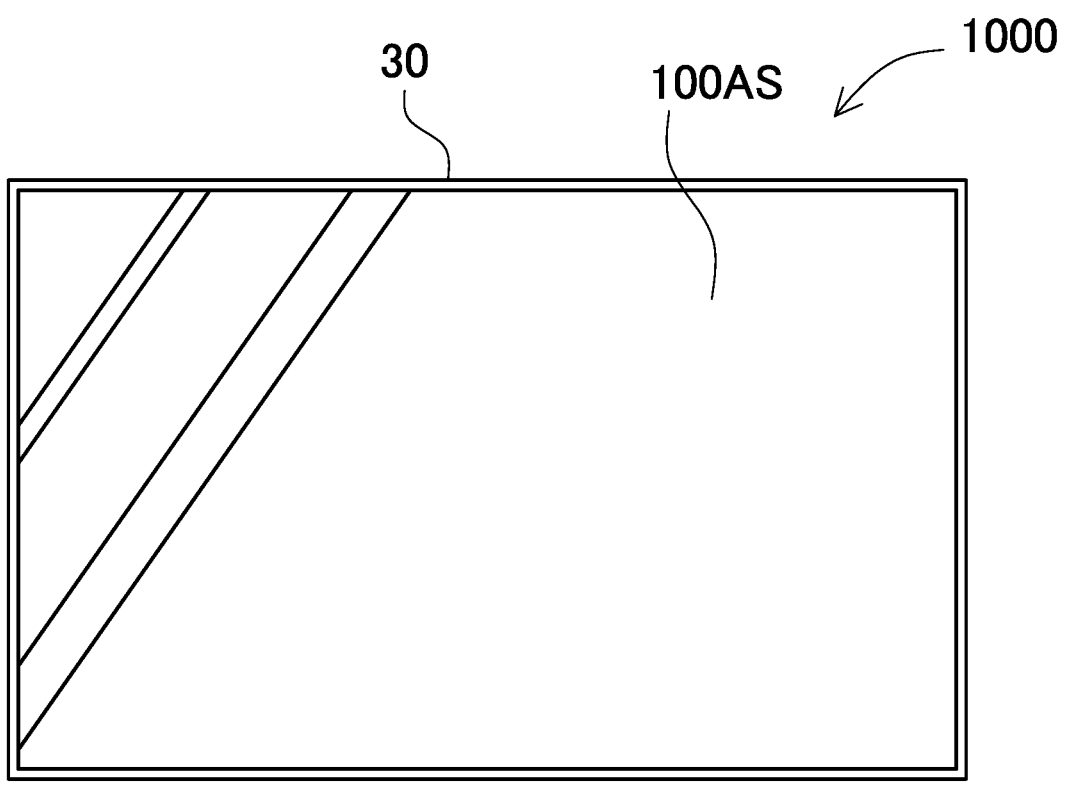
FIG. 1 is a plan view schematically showing a display according to a first embodiment of the present disclosure.

The embodiments will now be described with reference to the accompanying drawings, wherein like reference numerals designate corresponding or identical elements throughout the various drawings.

In the aforementioned light emitting device according to the present invention, the light emitting modules can have a rectangular outline as viewed in plan view, and the anode-side and cathode-side terminals can be arranged along opposite two sides of the rectangular outline. According to this arrangement, since the anode-side and cathode-side terminals are arranged along opposite two sides of the light emitting module, the comb-tooth portion can be electrically connected to any parts of the light emitting module on the opposite two sides. Therefore, high freedom of design can be achieved.

The comb-tooth portions can pass through parts of transverse sides of the light emitting modules which are transverse to the extension lines of the comb-tooth portions.

The width of the comb-tooth portions can be smaller than half the width of the light emitting modules. The comb-tooth portions can efficiently electrically connect the light emitting modules which are arranged side by side to each other.

The wiring board can have a comb shape that includes a plurality of comb-tooth portions. The slit parts can be formed between the neighboring comb-tooth portions. According to this arrangement, heat dissipation performance can be improved by the heat-dissipating plates arranged alternately with the comb-tooth portions, in other words, between the comb-tooth portions.

The slit parts can have an open end on one side.

The plurality of slit parts can have the same width.

The plurality of slit parts can extend along the extension direction of the comb-tooth portions, and be substantially evenly spaced away from each other. According to this arrangement, two wiring boards which have comb-tooth portions can be produced from one sheet of material with their comb-tooth portions being alternately arranged in a wiring board formation process.

The heat-dissipating plates or parts of a heat-dissipating plate can include an elongated shape extending along the corresponding slit.

The heat-dissipating plates can have an elongated rectangular shape. The heat-dissipating plates or parts of a heat-dissipating plate can have a thickness substantially equal to the comb-tooth portions.

The heat-dissipating plates or parts of a heat-dissipating plate can be formed of a metal plate.

The light emitting device further can include a driving circuit that controls the driven level of the plurality of light emitting modules. The wiring board can include a circuit connection portion that connects ends of the plurality of comb-tooth portions on one side of the comb shape to each other, and is connected to the driving circuit.

The plurality of light emitting elements can be arranged in a matrix arrangement on their light emitting module.

The wiring board can be formed of FPC.

The light emitting modules further can include a light-transmissive light-guiding plate in which the plurality of light emitting elements are arranged. The light-transmissive light-guiding plate can include a first main surface that serves as a light emission surface through which light outgoes, and a second main surface opposite to the first main surface.

The light-guiding plate can include a plurality of recessed parts in the second main surface. A light emitting surface of the light emitting element can be face its corresponding recessed part.

The plurality of light emitting elements can include a wavelength conversion member on or above their light emitting surface.

The light emitting elements can include a light-transmissive member that covers the main light emitting surface of the light emitting element, and a first light-reflective member that covers the side surfaces of the light emitting element.

The light emitting device can further include a liquid crystal panel that is arranged over the light emitting screen, and a panel member that is interposed between the light emitting screen and the liquid crystal panel. This light emitting device can be a liquid crystal display which includes a backlight constructed of the light emitting modules.

The following description will describe embodiments according to the present invention with reference to the drawings. In the following description, although terms for indicating particular directions or positions (e.g., "upper" and "lower", and other terms including these terms) will be used as necessary for ease of understanding the present with reference to the drawings, the technical scope of the present invention is not limited by these terms. Portions attached with the same reference sign in different drawings show the portions or members same as or similar to each other. The term "comprising" a member used in this specification means that the member is included both as a separate member and a unitary member.

It should be appreciated, however, that the embodiments described below are illustrations of a light emitting device to give a concrete form to technical ideas of the invention, and a light emitting device of the invention is not specifically limited to description below. Unless otherwise specified, any dimensions, materials, shapes and relative arrangements of the parts described below are given as an example and not as a limitation. In addition, the description for one embodiment may be applied to other embodiments or examples. Additionally, the sizes and the arrangement relationships of the members in the drawings are occasionally shown larger exaggeratingly for ease of explanation.

A light emitting device according to a first embodiment is now described which is intended to be used for a liquid crystal display backlight. The uses of a light emitting device according to the present invention are not limited to liquid crystal display backlights but can include LED displays which have LEDs as pixels, display board, lighting, and the like.

First Embodiment

Figure 2:
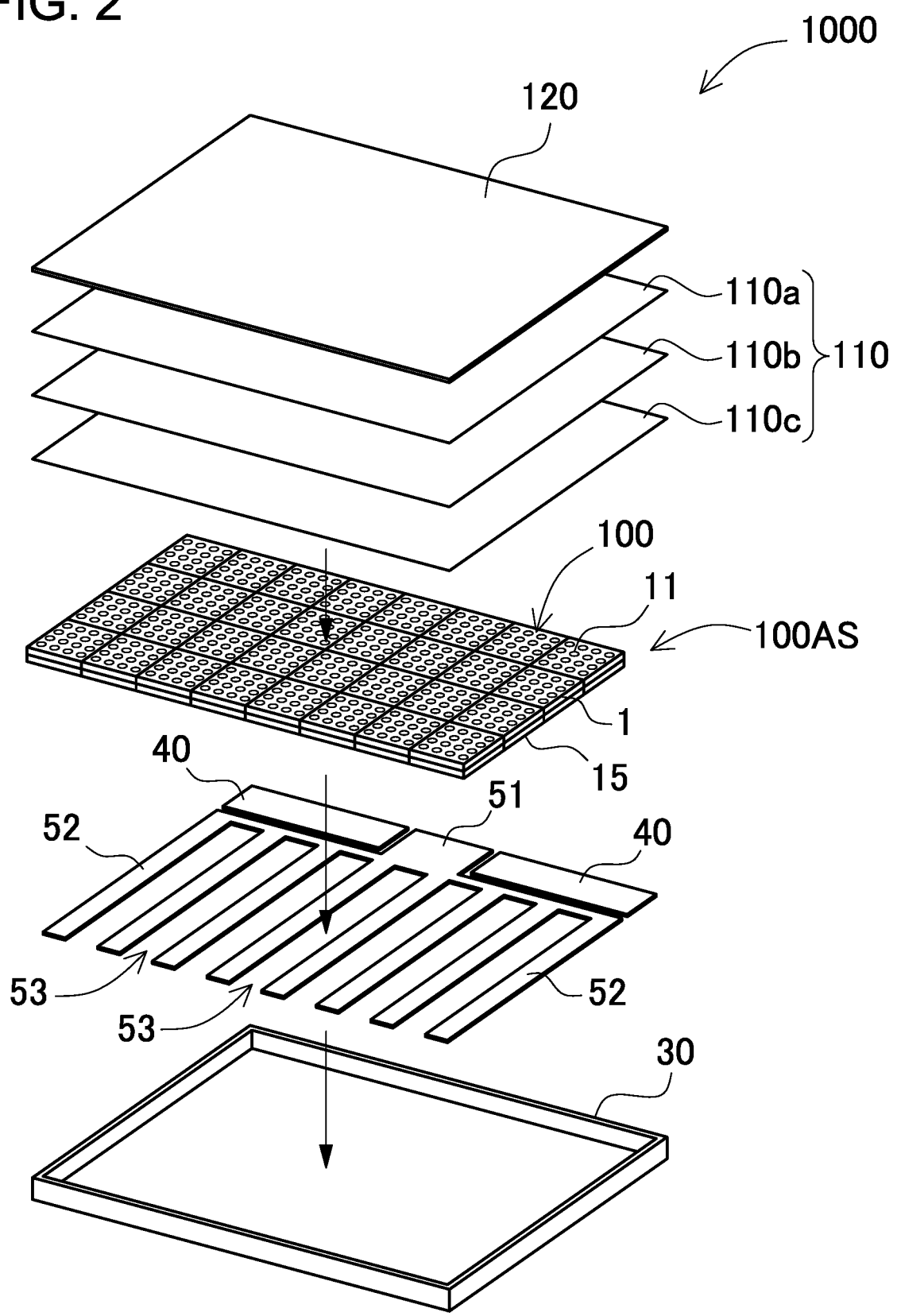
FIG. 2 is an exploded perspective view showing the display shown in FIG. 1.
Figure 3:
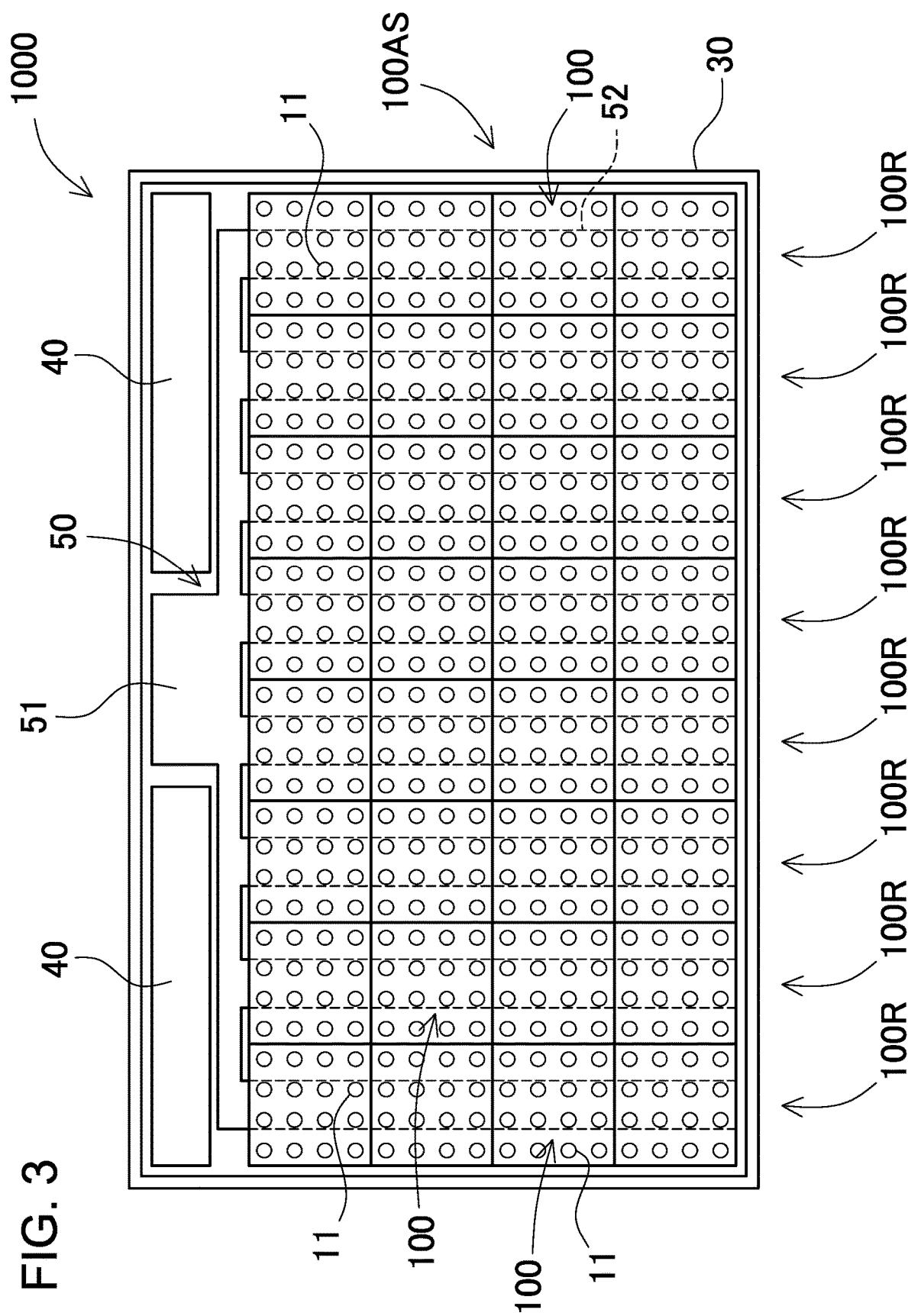
FIG. 3 is plan view schematically showing the display without a liquid crystal panel and a panel member (i.e., removed from the display in FIG. 2).

FIG. 1 is a plan view schematically showing a display 1000 which include a light emitting device according to a first embodiment. FIG. 2 shows an exploded perspective view showing the display 1000. FIG. 3 is plan view schematically showing the display 1000 without a liquid crystal panel 120 and a panel member 110 (i.e., removed from the display 1000 in FIG. 2). The illustrated display 1000 has a rectangular shape as viewed in plan view. A light emitting module assembly 100AS which includes a number of light emitting elements 11 is arranged behind the panel member 110, i.e., on the light emitting screen shown in FIG. 3. The display 1000 has a so-called direct backlight with the light emitting elements 11 being arranged on the back side of the liquid crystal panel 120. Also, the light emitting elements can be grouped into specific areas which have a certain number of light emitting elements to control ON/OFF of the specific areas of light emitting elements, i.e., to provide so-called back-lit local dimming.

(Display 1000)

As shown in the exploded perspective view of FIG. 2, the display 1000 serves as a liquid crystal display device, and includes a liquid crystal panel 120, a panel member 110 that is arranged behind the liquid crystal panel 120, a light emitting module assembly 100AS that is arranged behind the panel member 110, a wiring board 50 that is arranged behind the light emitting module assembly 100AS, a driving circuit 40 that is connected to the wiring board 50, and a frame member 30 that holds these components.

The liquid crystal panel 120 is irradiated through the panel member 110 with light which is emitted by light emitting modules 100 in the display 1000. The panel member 110 includes two lens sheets 110a and 110b, and a diffusion sheet 110c in this order from the top side. In addition to these sheets, the panel member 110 may include a polarizing film, a color filter, and the like if necessary.

(Light Emitting Module Assembly 100AS)

The light emitting module assembly 100AS includes a number of light emitting modules 100 which are arranged in a matrix arrangement on a common plane as shown in FIGS. 2 and 3. When the light emitting modules 100 are arranged in the matrix arrangement with their light emission surfaces being located on the common plane side (upper surface side in FIG. 2), the light emitting module assembly 100AS forms the light emitting screen.

(Light Emitting Module 100)

Figure 4:
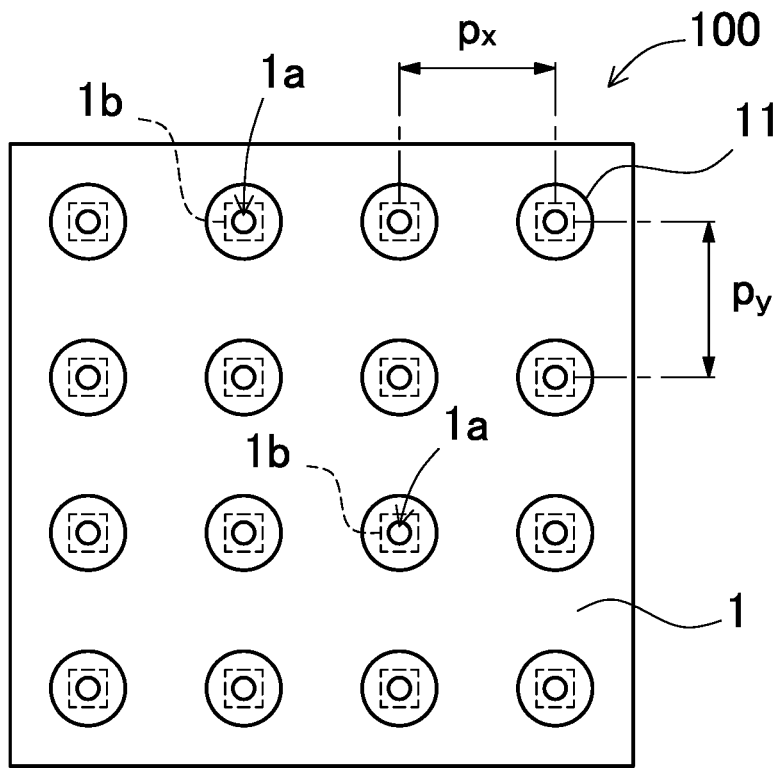
FIG. 4 is a plan view showing a light emitting module of the present disclosure.
Figure 5:
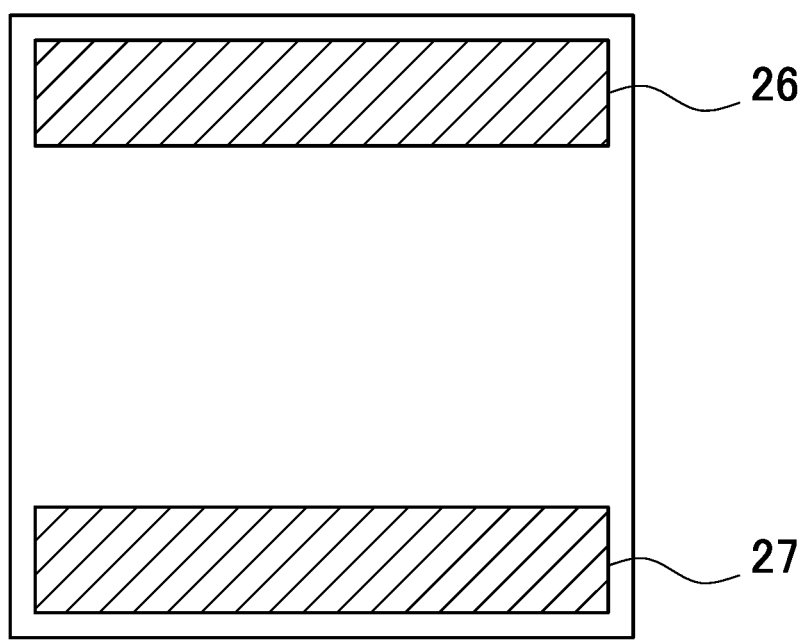
FIG. 5 is a bottom view showing the light emitting module shown in FIG. 4.

FIGS. 4 and 5 show plan and bottom views of the light emitting module 100, respectively. As shown in FIGS. 4 and 5, the light emitting module 100 has a rectangular shape as viewed in plan view. Also, the light emitting modules 100 include a number of light emitting elements 11. The light emitting elements 11 are preferably mounted in a matrix arrangement on the light emission surface of the light emitting module 100. It is noted that the arrangement pattern of the light emitting elements 11 is not limited to such a matrix arrangement. The light emitting elements can be arranged in any suitable pattern such as offset, slant and spiral arrangement. In the offset arrangement, the light emitting elements on one row are offset from the light emitting elements on another row. In the slant arrangement, the light emitting elements are arranged along slant lines. In the spiral arrangement, the light emitting elements are arranged along a spiral line. Specifically, in the light emitting module 100 shown in FIG. 4, total sixteen light emitting elements are arranged in four rows and four columns on the light emission surface. However, the total number, row number and column number of the light emitting elements can be modified to any numbers. The light emitting elements are preferably spaced at a fixed distance away from each other since this arrangement can provide uniform brightness.

Modified Embodiment

Figure 6:
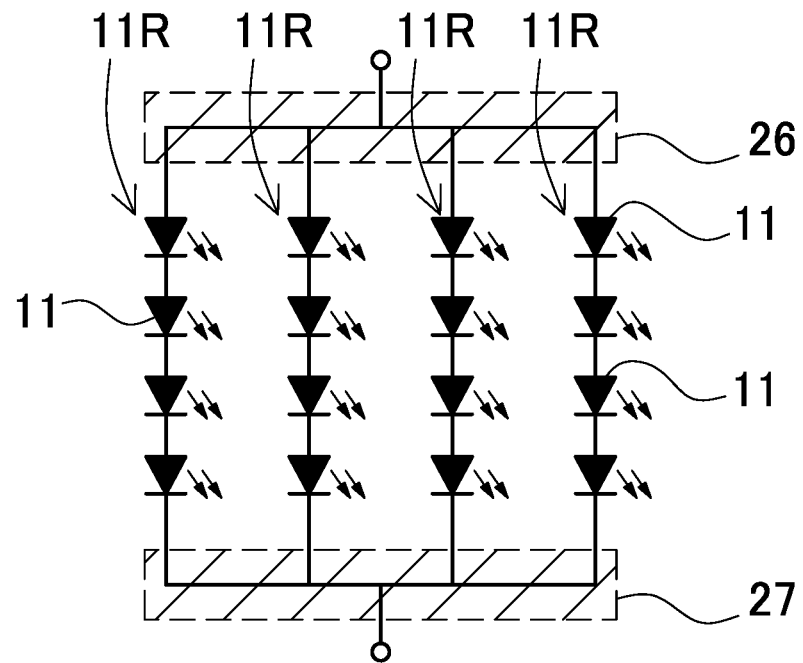
FIG. 6 is a circuit diagram showing the connection between light emitting elements which are included in the light emitting module.
Figure 7:
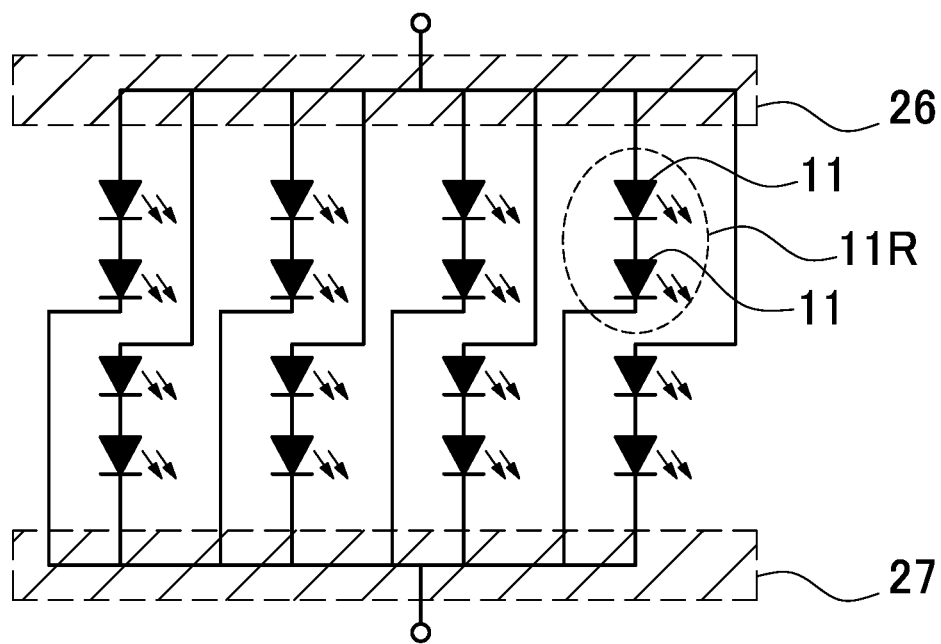
FIG. 7 is a circuit diagram showing the connection between light emitting elements in the light emitting device according to a modified embodiment.

The light emitting elements 11 that is included in one light emitting module 100 are connected in series or in parallel to each other. For example, in the light emitting module 100 shown in FIG. 6, four light-emitting-element sets 11R are connected in parallel to each other. Each of the light-emitting-element sets 11R includes four light emitting elements 11, which are connected in series to each other, as shown in FIG. 6. It is noted that the connection between light emitting elements is not limited to this. For example, as shown in the light emitting device according to a modified embodiment shown in FIG. 7, eight light-emitting-element sets 11R may be connected in parallel to each other. Each of the light-emitting-element sets 11R includes two light emitting elements 11, which are connected in series to each other. This modified embodiment can be applied not only to the first embodiment but also other embodiments described later.

The light emitting module 100 includes anode-side and cathode-side terminals 26 and 27 as terminals for supplying electric power to the light emitting elements 11 which are connected to each other either in series or parallel, or combinations of series and parallel connections. The first embodiment is further described again. Since each of the light emitting modules 100 includes the anode-side terminal 26 and the cathode-side terminal 27 for all the light emitting elements that are included in the corresponding one light emitting module, the flexibility of electrical connection can be high. For example, the pair of terminals 26 and 27 (anode-side and cathode-side terminals 26 and 27) are arranged on the back surface of the light emitting module 100. In this arrangement, the wiring between the light emitting elements 11 for their electrical connections can be simplified by the pair of terminals 26 and 27. For this reason, their electrical connections can be easily achieved. Also, this arrangement can ease constraints on their layout.

As shown in the bottom view of FIG. 5, it is preferable that the anode side terminal 26 is arranged along one side and the cathode side terminal 27 is arranged along the opposite side of the rectangular shape on the back surface of the light emitting module 100. According to this arrangement, since the anode-side and cathode-side terminals 26 and 27 are arranged along opposite two sides of the light emitting module 100, a comb-tooth portion 52 described later can be electrically connected to any parts of the light emitting module on the opposite sides. Therefore, high freedom of design can be achieved.

Figure 8:
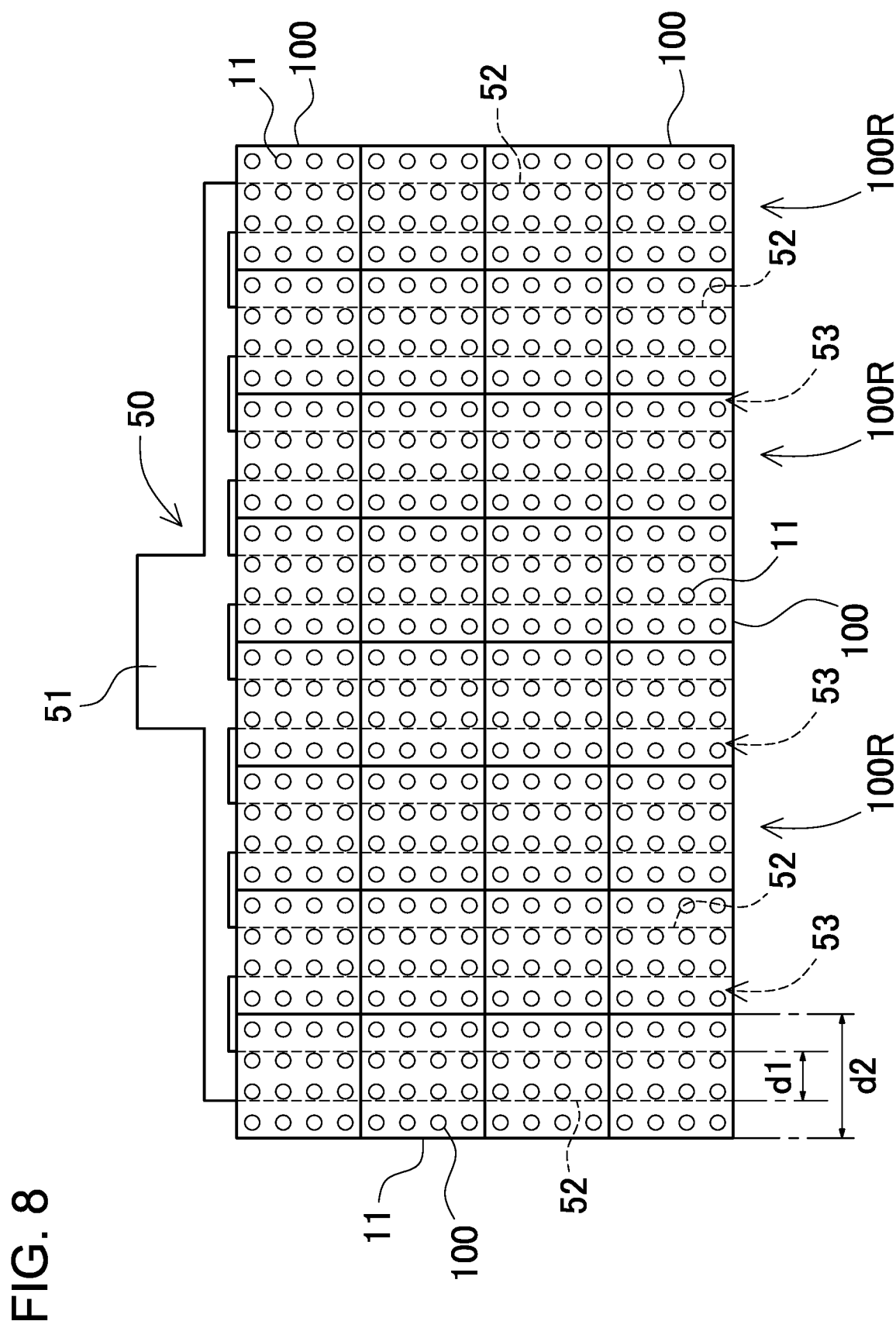
FIG. 8 is a plan view schematically showing the connection between the light emitting modules and a wiring board.
Figure 9:
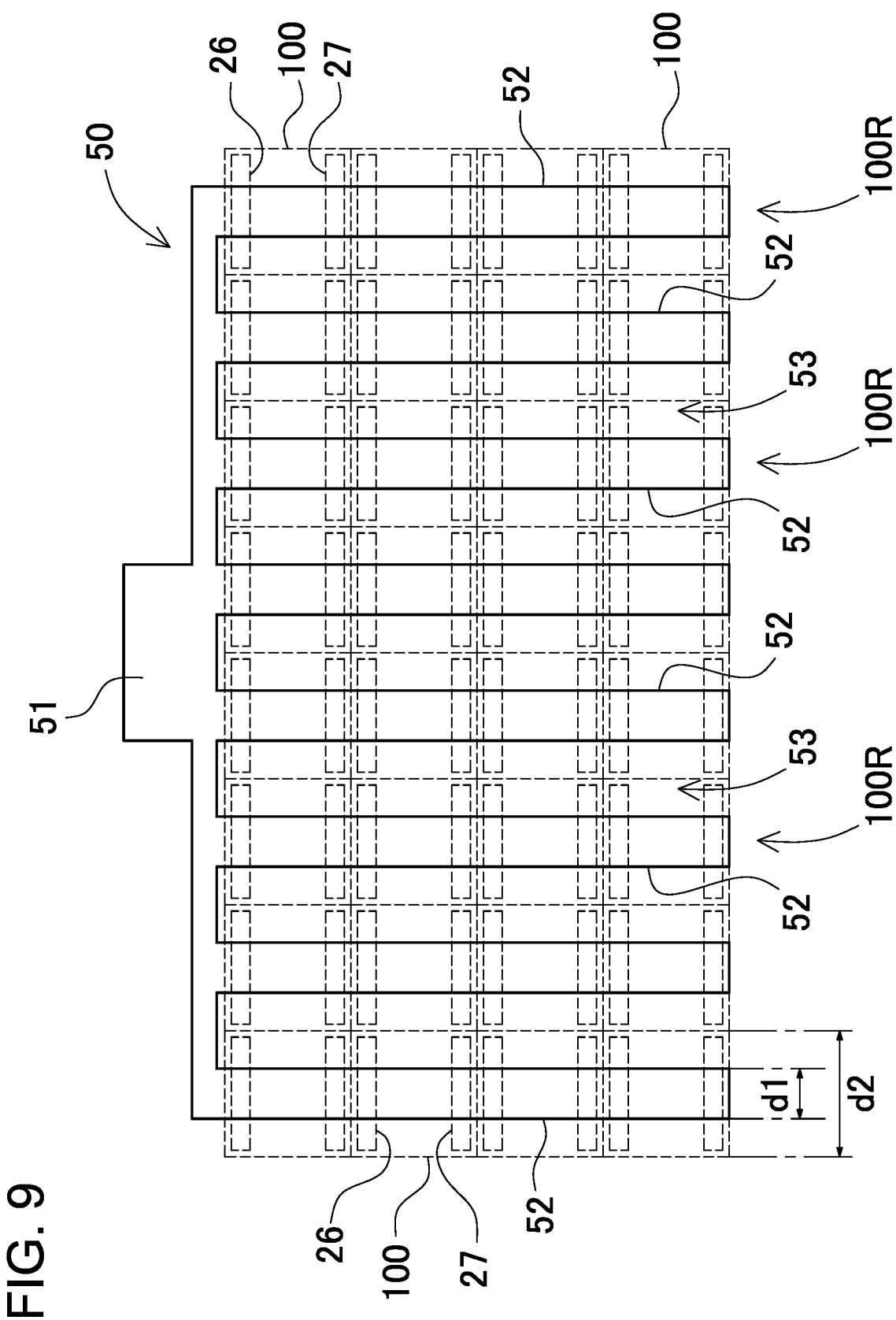
FIG. 9 is a plan view schematically showing the wiring board shown in FIG. 8.
Figure 10:
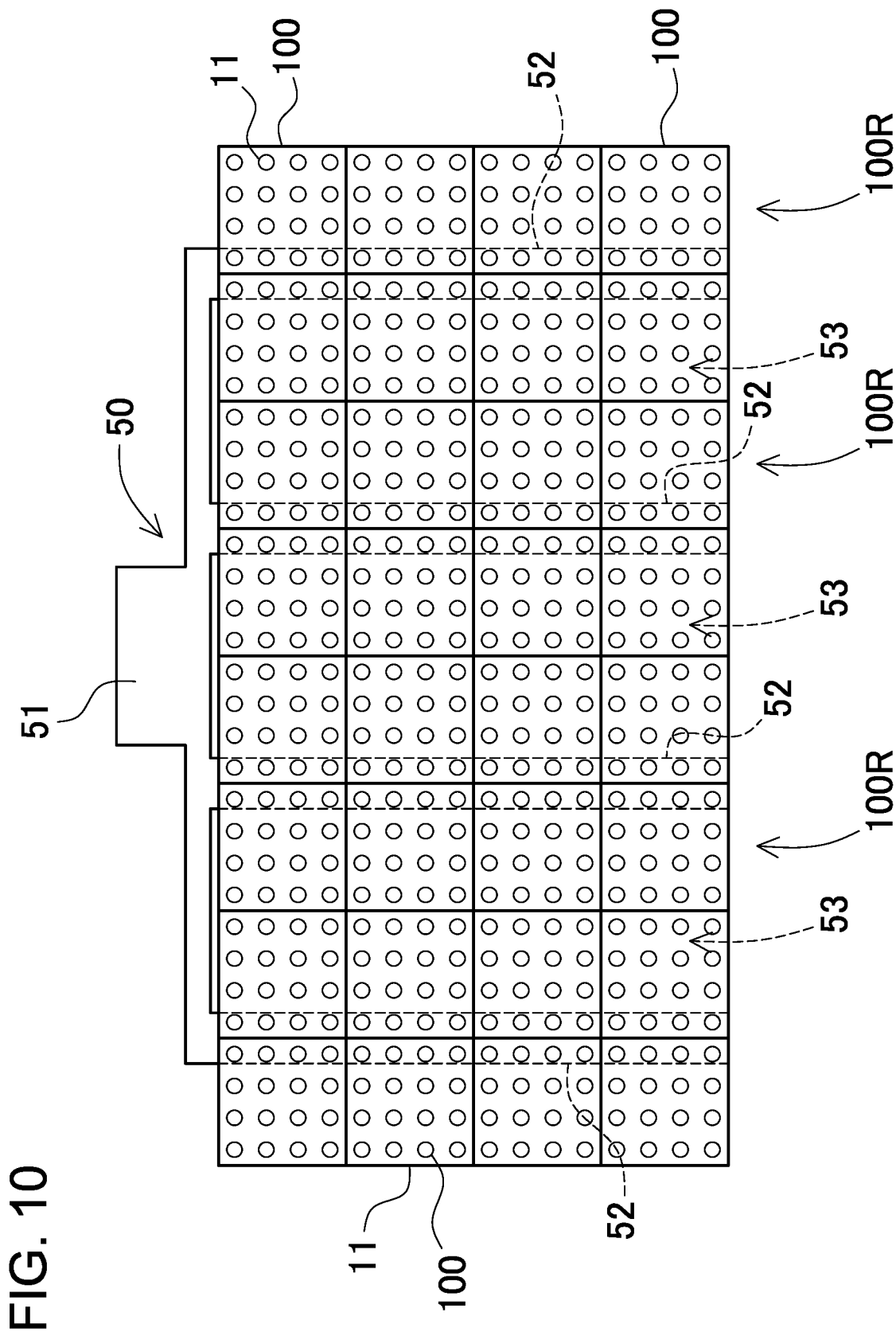
FIG. 10 is a plan view schematically showing the connection between the light emitting modules and the wiring board in a light emitting device according to a second embodiment of the present disclosure.

The wiring board 50 is arranged behind the light emitting module assembly 100AS. The light emitting modules 100 are electrically connected to the wiring board 50 through their anode-side and cathode-side terminals 26 and 27, as shown in FIGS. 8, 9, 10, etc. The light emitting modules 100 are connected to the driving circuit 40 through the wiring board 50. The driving circuit 40 controls the driven level (light intensity level) of the light emitting modules 100.

(Wiring Board 50)

The wiring board 50 is a member for electrical connection to the light emitting modules 100. The wiring board 50 has flexibility. Preferably, the wiring board is formed of a FPC board. The wiring board 50 is formed of a polyimide material, for example. As shown in FIG. 9, an electrical conduction pattern for electrical connection to the anode-side and cathode-side terminals 26 and 27 of the light emitting modules 100 is arranged on the surface of the wiring board 50.

(Comb-Tooth Portion 52)

The wiring board 50 has a comb shape that includes a number of comb-tooth portions 52 extending in the row or column direction of the matrix arrangement of the light emitting modules 100. The wiring board 50 includes a circuit connection portion 51 that connects ends of the comb-tooth portions 52 on one side of the comb shape to each other, and is connected to the driving circuit 40. The electrically conductive pattern for electrical connection to the light emitting modules 100 is formed on the surfaces of the comb-tooth portions 52 and the circuit connection portion 51. The comb-tooth portions 52 can pass through any parts or the roughly central parts of transverse sides of the light emitting modules 100 which are transverse to the extension lines of the comb-tooth portions.

(Frame Member 30)

The frame member 30 is a member for holding the light-emitting-module assembly 100AS connected to the wiring board 50, and the circuit board. The frame member 30 has a bottom closed box shape which opens upward. In order to have sufficient strength, the frame member 30 is formed of resin, metal, or the like.

(Local Dimming)

Figure 19:
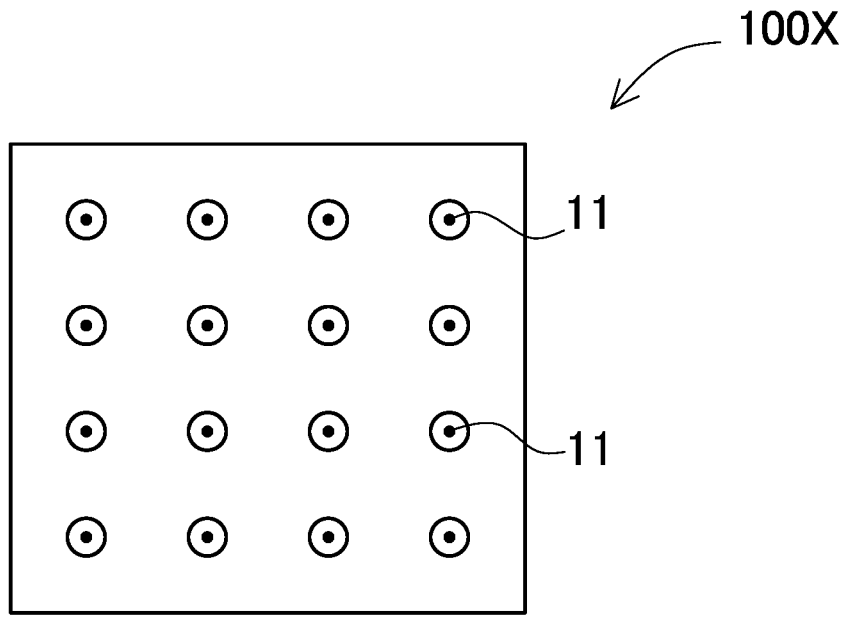
FIG. 19 is a plan view showing a known light emitting module.

According to the aforementioned light emitting device, there is an advantage that the light emitting modules can be individually dimmed (local dimming) and can be arranged in proximity to each other without using connectors between them. Known liquid crystal displays which include a number of light emitting elements arranged as a backlight source behind their back surface do not constantly turn their light emitting elements ON but partially turn them OFF (local dimming) to display high definition images. To achieve this, the light emitting elements are typically grouped into blocks so that the light emitting elements are controlled ON/OFF block by block. In recent years, large liquid crystal displays are required. In such a large liquid crystal display, it is difficult to mount a large number of light emitting elements on a single large mount board. For this reason, a number of rectangular light emitting modules 100X are prepared each of which includes a certain number of light emitting elements 11 as shown in FIG. 19. The light emitting modules 100X are arranged side by side to form a single sheet of large light emitting screen. In this case, in consideration of ease of control, the light emitting elements are often controlled ON/OFF module by module (light emitting modules 100X are individually dimmed)

Figure 20:
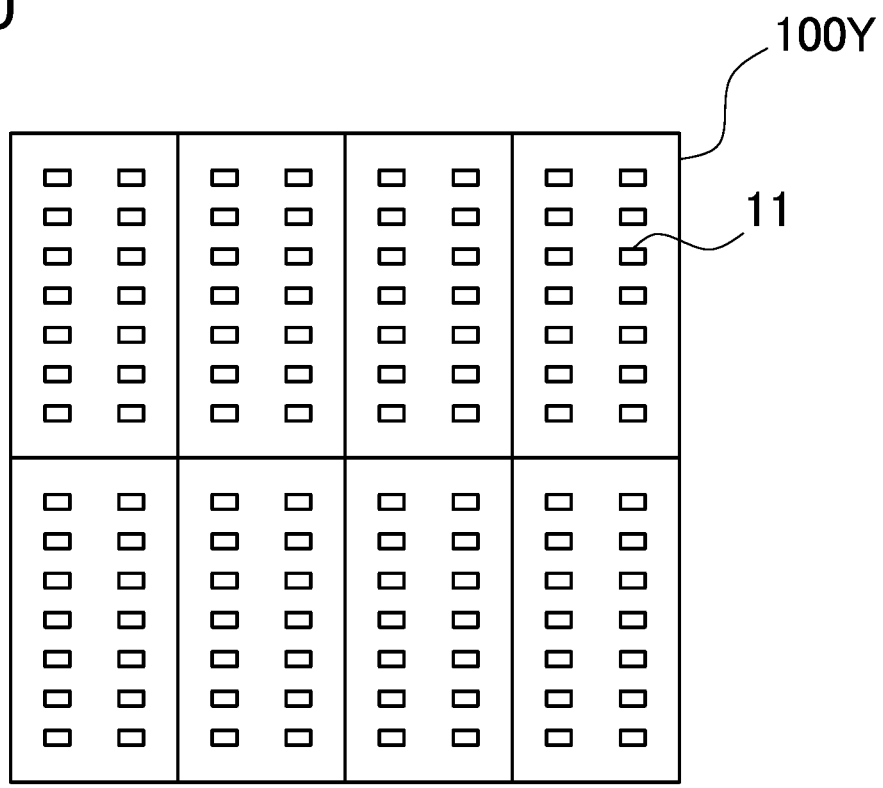
FIG. 20 is a plan view showing another known arrangement of light emitting modules.

In the case where a number of light emitting modules are used in combination with each other to form a large light emitting screen, the light emitting modules are necessarily connected to each other. In consideration of ease of connection, known light emitting modules have connectors for connecting the light emitting modules in series to each other along a single line to energize them and to provide signals to them. Such known light emitting modules are required to be arranged side by side without gaps. The reason is that the interval between light emitting elements is necessarily small in order to realize a high definition display. On the other hand, in consideration of tolerance of the connectors and ease of connection between them when such known light emitting modules are installed, the connectors are preferably connected to each other through cables extending from the light emitting modules. In this case, it is difficult for the cables to extend from surfaces of one light emitting module that face neighboring modules. For this reason, considering that the perimeter of the light emitting module 100Y is defined by their four surfaces or sides, a light emitting screen is constructed of light emitting modules 100Y which have at least one surface or side that does not face neighboring modules and is exposed outward from the light emitting screen as shown in FIG. 20, when the light emitting modules 100Y are arranged side by side.

Figure 21:
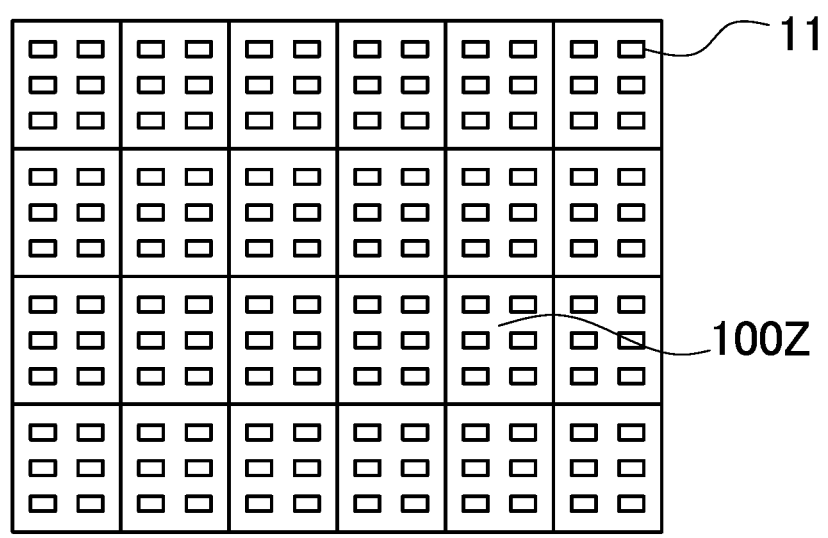
FIG. 21 is a plan view showing still another known arrangement of light emitting modules.

However, such known light emitting modules which define a light emitting screen in this manner have constraints on their size and shape. As a result, such known light emitting modules cannot realize a higher definition display. On the other hand, if a light emitting screen is constructed of small light emitting modules 100Z as shown in FIG. 21, all the surfaces of the light emitting module 100Z that is located in the central area of the screen face neighboring modules. As a result, their connectors may be incorrectly connected to each other.

In contrast to such a light emitting device which includes the aforementioned known light emitting modules, the light emitting modules 100 can be directly connected to the comb-tooth portions 52 of the wiring board 50 as shown in FIG. 8, since the light emitting device according to the first embodiment includes the flexible wiring board 50 which includes the comb-tooth portions 52, and the light emitting modules 100 on the back surface of which the anode-side and cathode-side terminals 26 and 27 are arranged as discussed above. According to this light emitting device, the light emitting modules can be connected to each other with relatively higher freedom without using connecting members such as connectors and cables and without necessity to take tolerance into consideration. That is, a light emitting screen is not necessarily constructed of light emitting modules which have at least one side that is located on the perimeter of a light emitting screen in order to provide a connector, a cable, or the like. In other words, even in the case where a light emitting module according to the present invention does not face the perimeter of the light emitting screen, the light emitting modules can be correctly connected to each other. Also, since connectors or the like are not used, space for providing such connectors or the like is not required. Accordingly, the light emitting modules can be arranged side by side without gaps. From this viewpoint, there is an advantage in arrangement of the light emitting modules.

In the arrangement where the anode-side and cathode-side terminals 26 and 27 which are arranged along opposite sides of the light emitting module 100, the light emitting modules can be correctly connected to each other by the comb-tooth portions 52 which extend along the light emitting modules 100 so as to pass through the anode-side and cathode-side terminals 26 and 27. The width d1 of the comb-tooth portion 52 can be smaller than the transverse width d2 of the light emitting module 100. In the case where the comb-tooth portions 52 have an elongated shape, the flexibility of the wiring board 50 can be improved, and its cost can be reduced. In addition, the width of the electrically conductive pattern formed on the comb-tooth portions 52 is substantially equal to or slightly smaller than the comb-tooth portion 52.

The transverse width of the comb-tooth portion 52 is preferably not greater than half the transverse width of the light emitting module 100. In the case where the light emitting modules 100 are arranged side by side without gaps in a lattice of uniform squares, the comb-tooth portions 52 pass through the roughly central parts of the light emitting modules 100 in the width direction as shown in FIG. 8 or the like. This arrangement can absorb tolerance to provide reliable electrical connection between the light emitting modules 100 and the comb-tooth portions 52.

The length of the comb-tooth portions 52 is preferably dimensioned so that the edges of the comb-tooth portions 52 substantially agree with the edges of the light emitting modules 100 that are arranged in the lowermost part of the screen when the light emitting modules 100 are mounted on the comb-tooth portions 52 as shown in FIG. 8 or the like. These comb-tooth portions can provide better appearance while the light emitting modules 100 can be mounted in a large area. However, in consideration of mounting tolerance and the like, the edges of the comb-tooth portions 52 may slightly protrude beyond the light emitting modules 100 that are arranged in the lowermost part when mounted. Alternatively, the comb-tooth portions 52 may be dimensioned so that the edges of the comb-tooth portions 52 are hidden under the lowermost light emitting modules 100.

Second Embodiment

In the embodiment shown in FIG. 8, one comb-tooth portion 52 passes through one column of the light emitting modules 100. This arrangement can form light-emitting-module columns 100R each of which is constructed of the light emitting modules 100 that are arranged on their corresponding comb-tooth portion 52. The light emitting modules 100 in each column are connected in series to each other. In this embodiment, eight comb-tooth portions 52 are connected in parallel to each other. Specifically, eight light-emitting-module columns 100R are connected in parallel to each other. That is, one comb-tooth portion 52 passes through only one light emitting module 100 in arbitrary one row or column which is transverse to the extension line of the comb-tooth portion. However, the present invention is not limited to this arrangement. One comb-tooth portion may pass through two or more light emitting modules in arbitrary one row or column which is transverse to the extension line of the comb-tooth portion. For example, in a light emitting device according to a second embodiment shown in FIG. 10, one comb-tooth portion 52 extends along the boundary between two light-emitting-module columns 100R which include their light emitting modules 100. In this arrangement, the two light-emitting-module columns 100R are connected in parallel to each other by one comb-tooth portion. Accordingly, total four comb-tooth portions connect eight light-emitting-module columns 100R in parallel to each other similar to the first embodiment. According to this arrangement, the number of comb-tooth portions can be reduced. Therefore, there is an advantage that the light emitting device can have a simple structure. The other components of the light emitting device according to the second embodiment can be similar to the first embodiment discussed above.

(Slit Part 53)

The wiring board 50 has a comb shape that includes a number of slit parts 53 extending in the row or column direction of the matrix arrangement of the light emitting modules 100. In the embodiment shown in FIG. 2 or the like, the slit parts 53 are formed between comb-tooth portions 52 adjacent to each other. The slit parts 53 have an open end on one side. This arrangement together with the elongated shape of the comb-tooth portions 52 allows light emitting screen to bend.

The slit parts 53 preferably have the same width. It is preferable that the slit parts 53 extend along the extension direction of the comb-tooth portions 52, and are substantially evenly spaced away from each other. According to this arrangement, two wiring boards which have comb-tooth portions 52 can be produced from one sheet of material with their comb-tooth portions being alternately arranged in a wiring board formation process.

Third Embodiment

Figure 11:
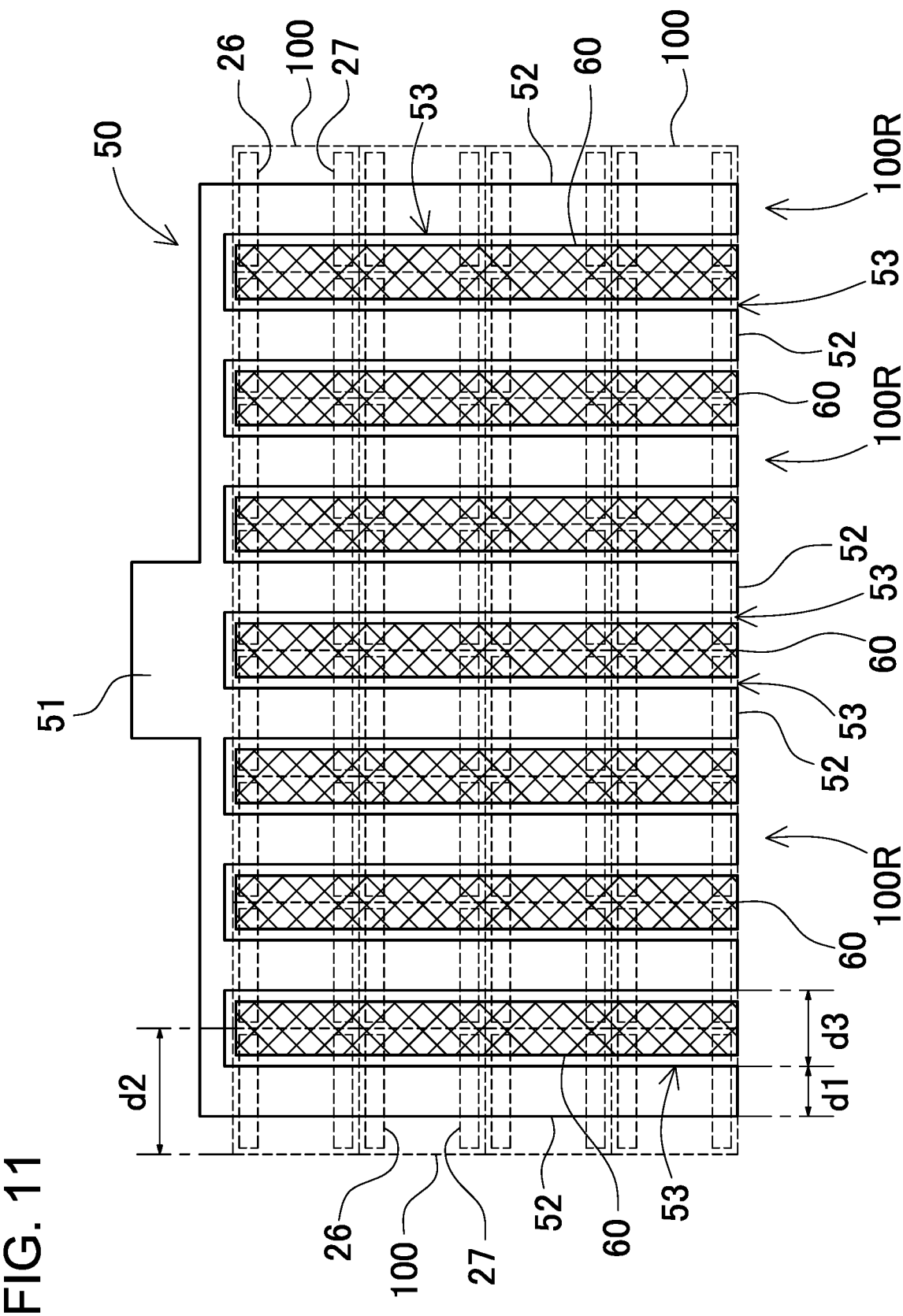
FIG. 11 is a plan view schematically showing a light emitting device according to a third embodiment of the present disclosure.

The aforementioned slit parts 53 between the comb-tooth portions 52 have an advantage that improves heat dissipation performance since the adjacent comb-tooth portions 52 are spaced away from each other. In order to further improve heat dissipation performance, heat-dissipating plates formed of a heat dissipative plate can be arranged in the slit parts 53. FIG. 11 is a plan view schematically showing this type of light emitting device according to a third embodiment. In this light emitting device, heat can be efficiently radiated by heat-dissipating plates 60, which are arranged in the slit parts 53 of the wiring board 50, from the light emitting modules 100, which are connected to each other along the wiring board 50. In particular, in the case of large screen displays which include a number of light emitting modules arranged in a matrix arrangement, it is difficult to ensure sufficient heat dissipation performance since a large number of light emitting modules are arranged close to each other. In addition, light emitting modules are becoming brighter. Correspondingly, the amount of their heat dissipation will be larger. For this reason, heat dissipation is becoming more important. To this end, in the light emitting device according to the third embodiment, the slit parts 53 which are formed in the wiring board 50 serve as space for accommodating heat-dissipating plates 60 in order to improve heat dissipation performance. The other components of the light emitting device according to the third embodiment can be similar to the first embodiment and the like discussed above.

(Heat-Dissipating Plate 60)

Figure 12:
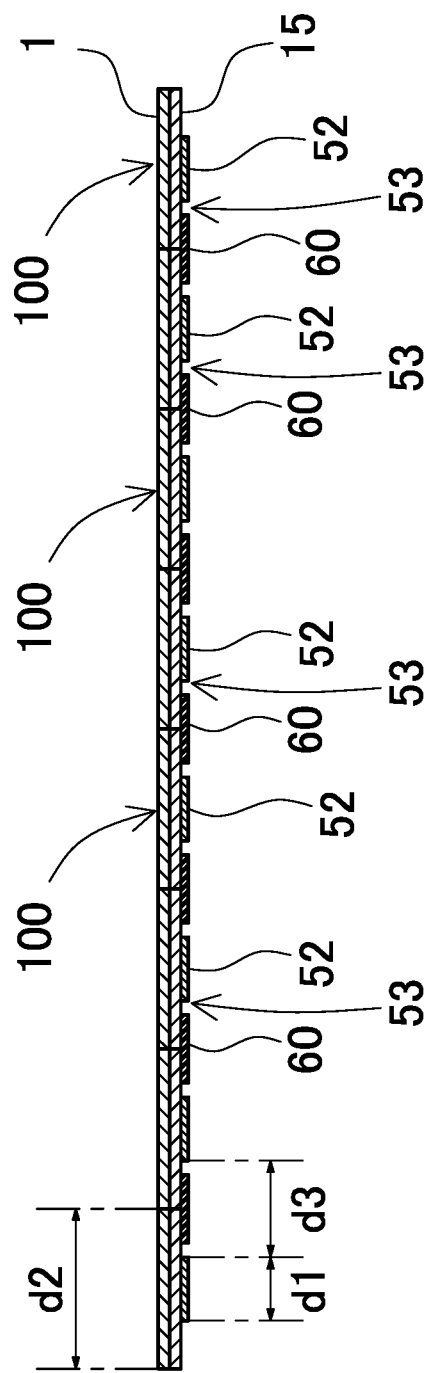
FIG. 12 is a cross-sectional view schematically showing the light emitting device shown in FIG. 11.

The heat-dissipating plates 60 include an elongated shape extending along the corresponding slit parts 53. For example, the heat-dissipating plates 60 have a width substantially equal to or slightly smaller than the width d3 of the slit parts 53. The heat-dissipating plates 60 are physically spaced away from the electrically-conductive patterns of the comb-tooth portions 52. This arrangement can effectively electrically insulate the electrically-conductive patterns from the heat-dissipating plates. As shown in a cross-sectional view of FIG. 12, the heat-dissipating plates 60 have substantially the same thickness as the comb-tooth portions 52.

The heat-dissipating plates 60 are formed of a thermally high conductive material such as metal plate, ceramic plate, or the like. Thus, heat dissipation performance can be improved by heat-dissipating plates 60 which are arranged alternately with the comb-tooth portions 52, in other words, between the comb-tooth portions 52. The width of the heat-dissipating plates 60 may be greater than the width d3 of the slit parts 53. In this case, the heat dissipation performance will be further improved.

Fourth Embodiment

Figure 13:
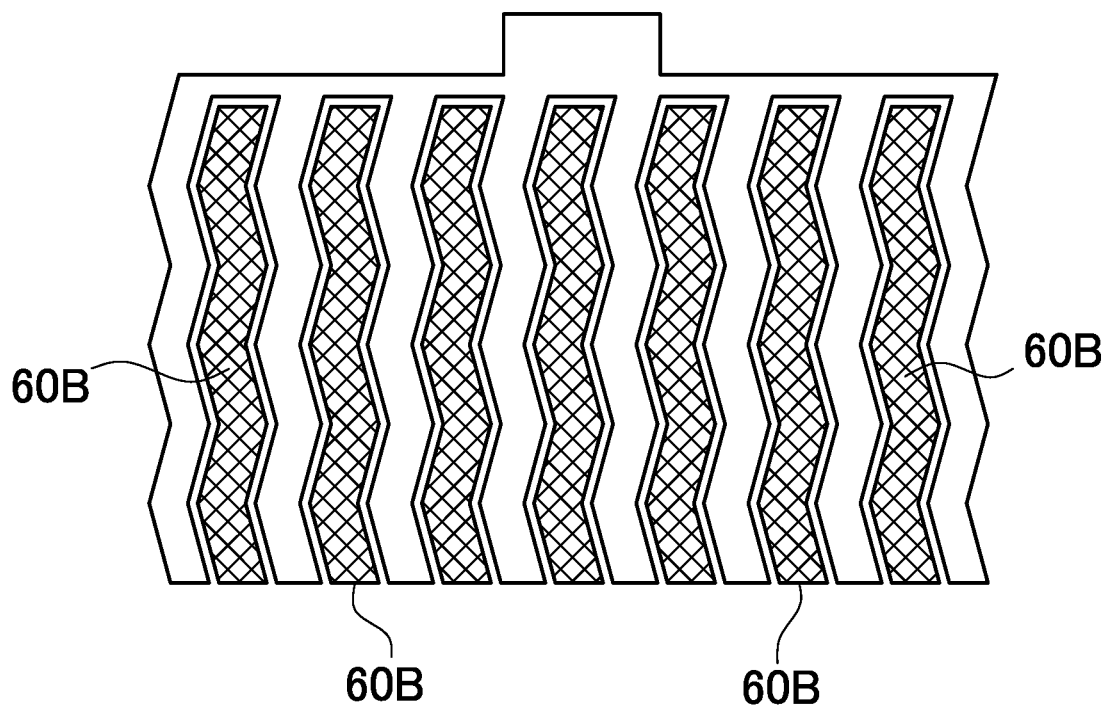
FIG. 13 is a plan view schematically showing a light emitting device according to a fourth embodiment of the present disclosure.

In the embodiment shown in FIG. 11, the heat-dissipating plates 60 have an elongated rectangular shape. However, the shape of the heat-dissipating plates 60 according to the present invention is not limited to such an elongated rectangular shape. The heat-dissipating plates may have any shape which can be arranged in the slit parts 53. For example, a light emitting device according to the present invention includes heat-dissipating plates 60B which have a zigzag shape as shown in FIG. 13. Also, the heat-dissipating plates may have a curved shape including arch shape, sine wave shape, and the like. In the case where heat-dissipating plates do not have a straight shape but have a bent shape, the length of the heat-dissipating plates can be increased. Correspondingly, the area of their heat-dissipating surface can be increased. As a result, the heat dissipation performance can be improved. The other components of the light emitting device according to the fourth embodiment can be similar to the first embodiment and the like discussed above.

Fifth Embodiment

Figure 14:
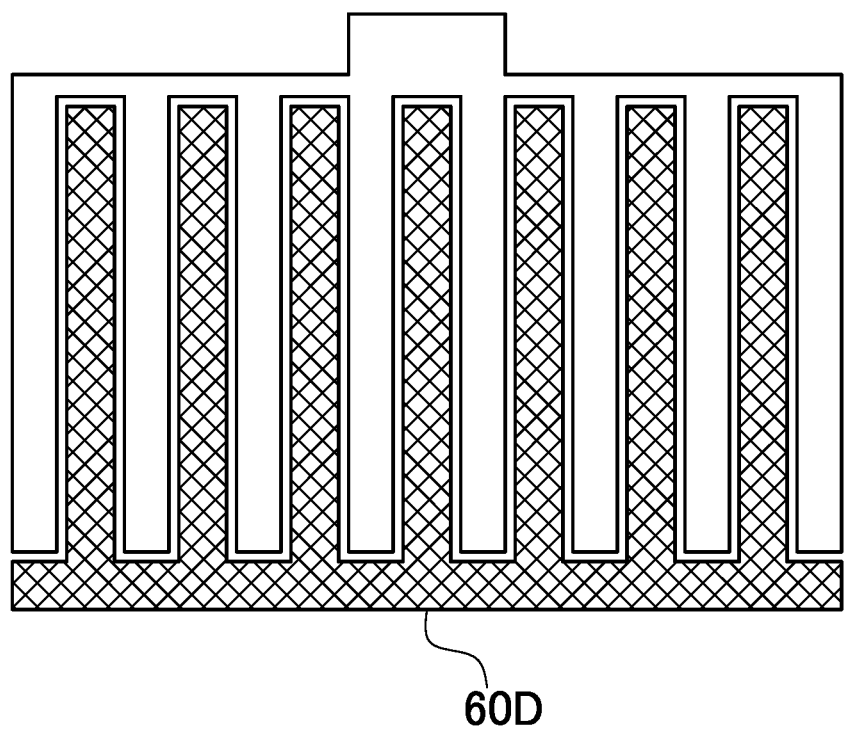
FIG. 14 is a plan view schematically showing a light emitting device according to a fifth embodiment of the present disclosure.

Although the heat-dissipating plates have been illustratively discussed which are separately formed and spaced away from each other, these heat-dissipating plates may be integrally formed as a single heat-dissipating plate. FIG. 14 shows this type of heat-dissipating plate according to a fifth embodiment. This illustrated light emitting device includes the comb-tooth portions 52, which form the slit parts 53 spaced away from each other. The slit parts 53 can be efficiently used by a single comb-shaped heat-dissipating plate 60D which has similar comb-tooth parts accommodated in the slit parts 53. According to this arrangement, since the single heat-dissipating plate 60D can be obtained by connecting a number of heat-dissipating plates according to the foregoing embodiments to each other by a connecting part, the area of the heat-dissipating plate 60D can be relatively increased. Therefore, the heat-dissipating plate 60D is advantageous in terms of heat dissipation. Also, two heat-dissipating plates 60D which have such a comb shape can be produced from one sheet material by deviating their positions from one another in a counter arrangement similar to the aforementioned wiring board 50. Therefore, there is an advantage that yields can be improved. The other components of the light emitting device according to the fifth embodiment can be similar to the first embodiment and the like discussed above.

Sixth Embodiment

Figure 15:
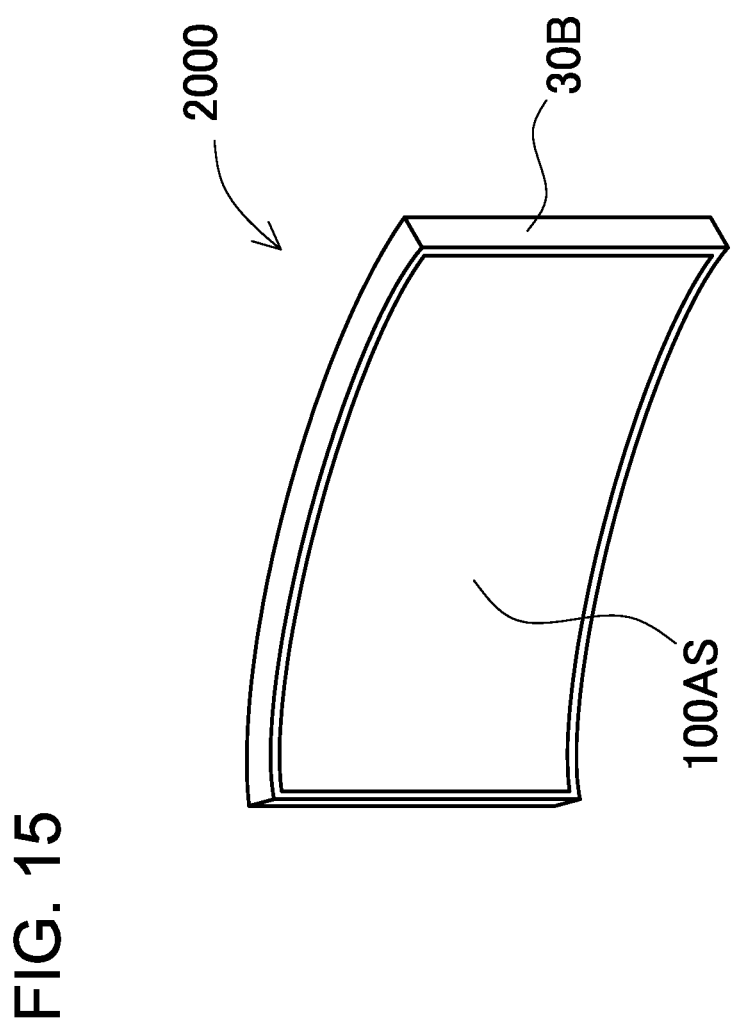
FIG. 15 is a perspective view showing a light emitting device according to a sixth embodiment of the present disclosure.
Figure 16:
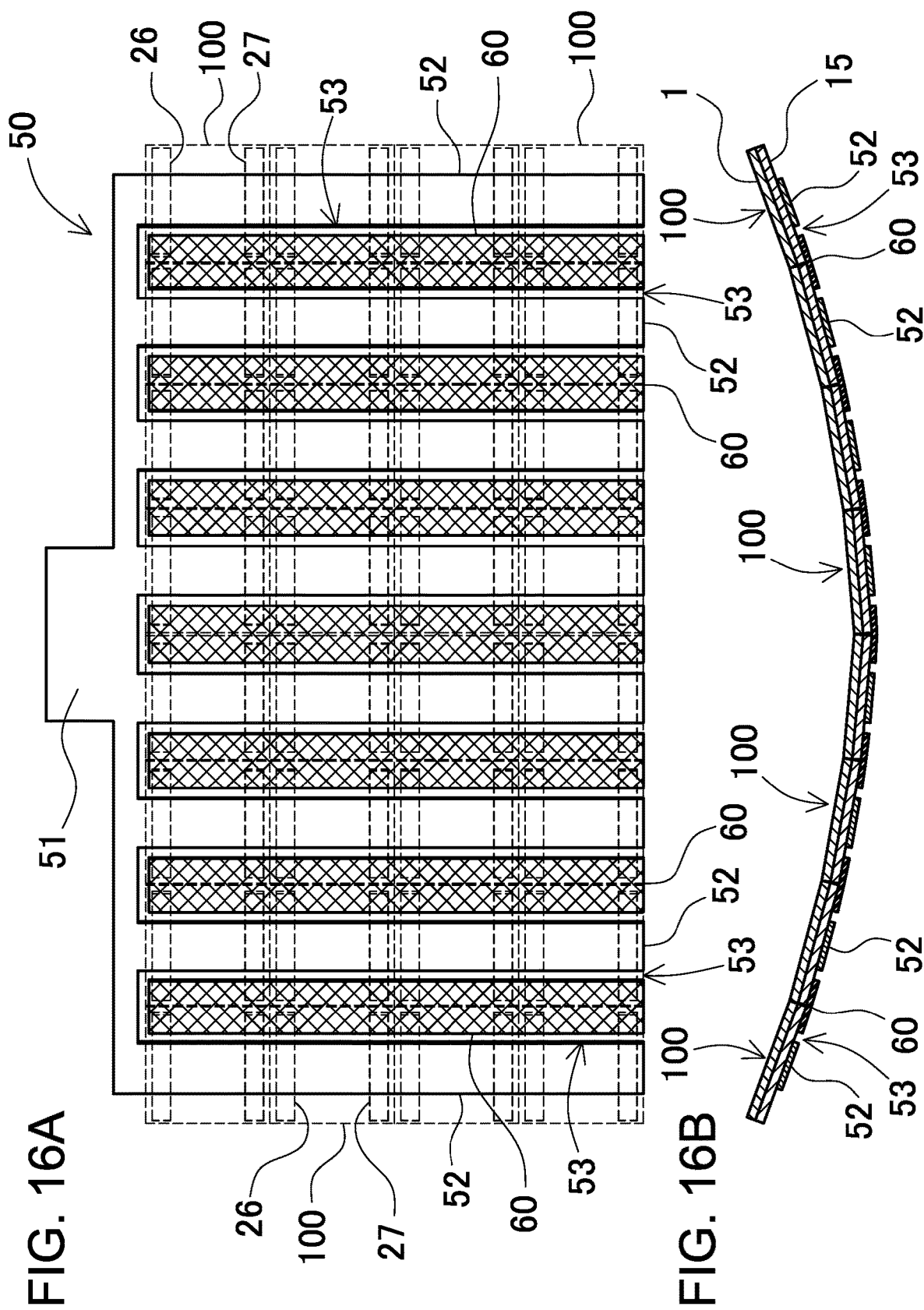
FIG. 16A is a plan view showing a wiring board in the light emitting device shown in FIG. 15.
FIG. 16B is a cross-sectional view showing the wiring board shown in FIG. 16A.

The light emitting devices according to the foregoing embodiments have been illustratively discussed which include a flat light emitting screen. However, the present invention is not limited to such a flat light emitting screen. The light emitting device according to the present invention can include a curved light emitting screen. As this type of light emitting device, a light emitting device according to a sixth embodiment is described with reference to a perspective view of FIG. 15, a plan view of FIG. 16A, and a cross-sectional view of 16B. A display 2000 as the illustrated light emitting device according to a sixth embodiment includes a number of light emitting modules 100 which are arranged side by side and form a large light emitting screen.

The light emitting screen is curved in the longitudinal direction. In this embodiment, a frame member 30B is correspondingly curved in the direction perpendicular to the extension direction of the comb-tooth portions 52 whereby forming the curved light emitting screen. Since the wiring board 50 includes a number of comb-tooth portions 52 which provide the slit parts 53 between the comb-tooth portions 52 as discussed above, the comb-tooth portions are flexible, in other words, can be translated while keeping parallel to each other (the wiring board has a degree of freedom in the depth direction). As a result, the wiring substrate can be easily bent by moving the comb-tooth portions from one to another in the depth direction. This arrangement allows the light emitting screen to bend even though the semiconductor light emitting elements such as light emitting diodes are used. That is, although it has been said that such a curved light emitting screen can be formed by only a display which includes a flexible board (e.g., organic EL display) and cannot formed by liquid crystal displays, the comb-shaped wiring board 50 allows even a liquid crystal display which includes light emitting diode to form a curved screen. The light emitting device according to this embodiment can additionally include the aforementioned heat-dissipating plates 60 and the like if necessary. The other components of the light emitting device according to the sixth embodiment can be similar to the first embodiment and the like discussed above.

(Specific Construction of Light Emitting Module 100)

Figure 17:
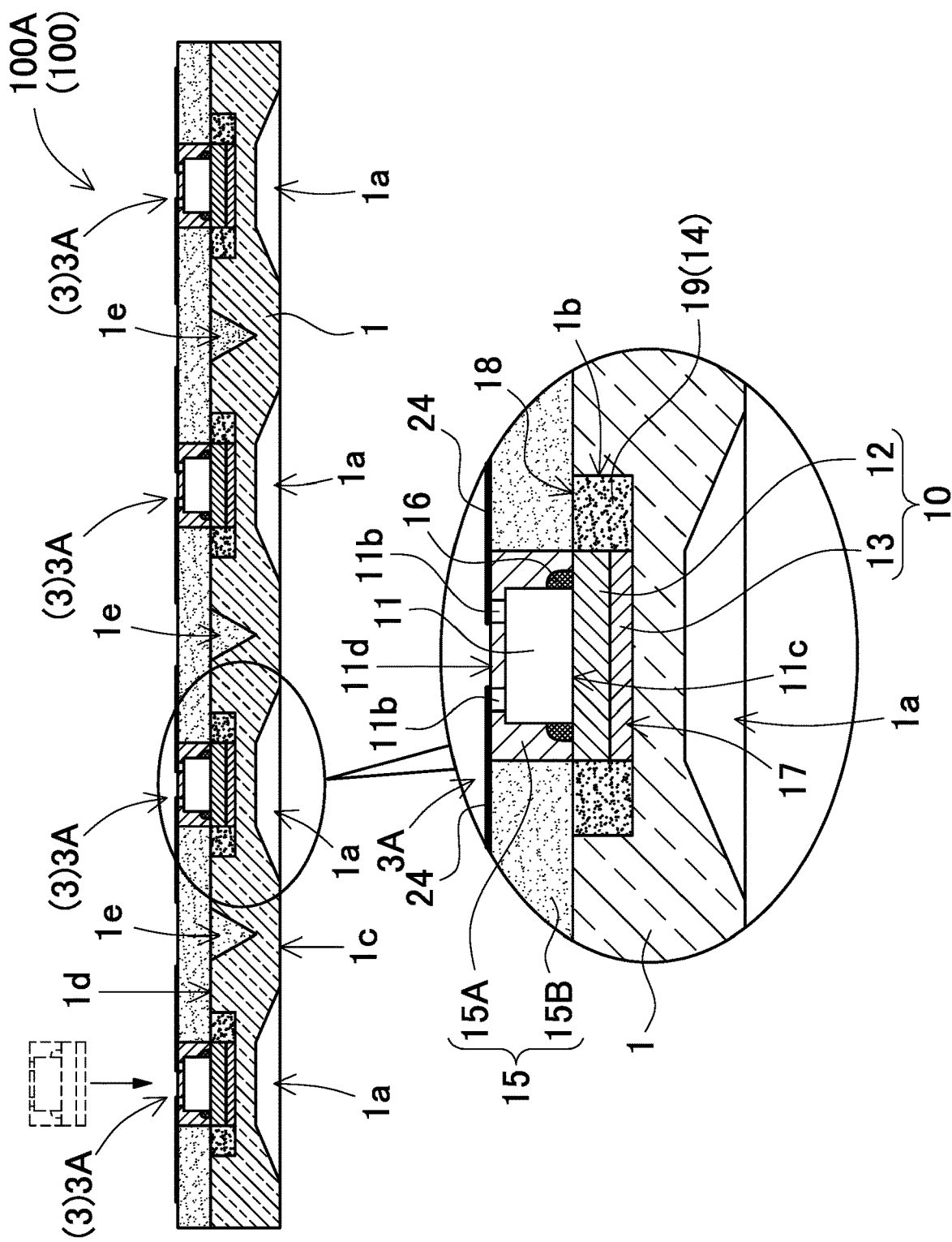
FIG. 17 is a cross-sectional view schematically showing the light emitting module according to the first embodiment with a part of the light emitting module being shown in a partially enlarged cross-sectional view where a light-guiding plate is located on the lower side, in other words, upside down relative to FIG. 2.

The specific construction of the light emitting module 100 is now described with reference to a cross-sectional view of FIG. 17 schematically showing the light emitting module 100 shown in FIGS. 2 and. 4 with a part of the light emitting module being shown in a partially enlarged cross-sectional view.

(Light-Guiding Plate 1)

The light emitting module 100 includes a light-transmissive light-guiding plate 1 which has the light emitting elements 11 inside this plate, as shown in FIGS. 2 and 4. A sealing resin portion 15 is arranged on the back surface of the light-guiding plate 1, as shown in FIG. 2. The light-guiding plate 1 has a first main surface 1c, and a second main surface 1d opposed to the first main surface 1c, as shown in FIG. 17. The first main surface 1c serves as the light emission surface through which light outgoes. A number of recessed parts are formed on the second main-surface 1d of the light-guiding plate 1. The light emitting surface of the light emitting element 11 faces its corresponding recessed part. The light emitting element 11 can include a wavelength conversion member on or above its light emitting surface. The light emitting element 11 includes a light-transmissive member that covers its main light emitting surface, and a first light-reflective member that covers its side surfaces.

(Sealing Resin Portion 15)

The sealing resin portion 15 is attached to the second main-surface 1d of the light-guiding plate 1 of the light emitting module 100. Preferably, the sealing resin portion 15 is a white resin which is formed of a transparent resin added with white powder or the like as additive for reflecting light. The sealing resin portion 15 of a white resin reflects light from the light emitting elements 11, and directs the light toward the first main surface 1c so that the light is emitted outward from the light-guiding plate 1.

In the light emitting module 100 shown in FIG. 17, the recessed parts 1b are formed on one sheet of light-guiding plate 1. The light emitting elements 11 are accommodated in the recessed parts 1b. Also, the light emitting module 100 can be replaced with a light emitting module 100' which include a number of light emitting bits 5 each of which is formed of a light-guiding plate 1' having one recessed part 1b as shown in a schematic bottom view of FIG. 18. The light emitting element 11 is located in the recessed part 1b. The light emitting bits 5 are arranged in a matrix arrangement.

The light emitting module 100 shown in FIG. 17 includes a light-guiding plate 1, a light diffusion portion 13 that is arranged in the recessed part 1b of the light-guiding plate 1, a wavelength converting portion 12 that is laminated on the light diffusion portion 13, and the light emitting elements 11 that are arranged on the surface of the wavelength conversion portion 12. In the light emitting module 100A shown in FIG. 17, fixed onto the light-guiding plate 1 are light-emitting-element units 3A each of which is integrally constructed of a light adjustment portion 10 and the light emitting element 11. The light adjustment portion 10 includes the laminated wavelength converting portion 12 and light diffusion portion 13. The light-emitting-element unit 3A of the light emitting module 100A shown in FIG. 17 includes a first sealing resin portion 15A in which the light emitting element 11 is embedded. The peripheral surfaces of the first sealing resin portion 15A are coplanar with the peripheral surfaces of the light adjustment portion 10, which includes the laminated wavelength converting portion 12 and light diffusion portion 13. In the light emitting module 100A, a second sealing resin portion 15B is formed on the second main surface 1d of the light-guiding plate 1 to which the light-emitting-element unit 3A is fixed. The light-emitting-element units 3A are embedded in the second sealing resin portion 15B. The light emitting module 100A shown in FIG. 17 is now described which includes the light-emitting-element units 3A fixed to the recessed parts 1b of the light-guiding plate 1. Each of the light-emitting-element units 3A is integrally constructed of the light adjustment portion 10 and the light emitting element 11. The light adjustment portion 10 includes the laminated wavelength converting portion 12 and light diffusion portion 13.

In the light-emitting-element unit 3A shown in FIG. 17, the light emitting element 11 is bonded onto the surface of the light adjustment portion 10, which includes the laminated wavelength converting portion 12 and light diffusion portion 13. The light emitting element 11 has an upper surface as electrode formation surface 11d, and a lower surface as light emitting surface 11c. The light emitting element 11 emits light mainly from the light emitting surface 11c, and irradiates the wavelength converting portion 12 with the light. In the light emitting module 100A of FIGS. 4 and 17, the light-emitting-element units 3A are arranged on the light-guiding plate 1, and fixed into the recessed parts 1b which are arranged in a matrix arrangement and formed on the light-guiding plate 1. The first main surface 1c of the light-guiding plate 1 serves as the light emitting surface through which the light outgoes. The recessed parts 1b are formed on the second main-surface 1d. The recessed part 1b accommodates a part of light-emitting-element unit 3A, that is, the light adjustment portion 10 in FIG. 17 which is constructed of the light diffusion portion 13 and the wavelength conversion portion 12 laminated on the light diffusion portion 13. The wavelength converting portion 12 of the light adjustment portion 10 is located on the light-emitting-element 11 side, and the light diffusion portion 13 is arranged on the bottom-surface side of the recessed part 1b of the light-guiding plate 1. The light diffusion portion 13 of the light adjustment portion 10 diffuses light which passes through the wavelength conversion portion 12 so that the diffused light enters light-guiding plate 1. The light emitted from the light-guiding plate 1 can be uniformly distributed by the light diffusion portion 13.

In the light emitting module 100 according to the embodiment, the recessed parts 1b are formed on the light-guiding plate 1 so that the light adjustment portions 10 of the light-emitting-element unit 3 are accommodated in their recessed part 1b. Therefore, the light emitting module 100 can be entirely thin. Also, since the recessed parts 1b are formed on the light-guiding plate 1 so that each of the recessed parts 1b accommodates the light adjustment portions 10 of the light-emitting-element unit 3, misalignment between the light-emitting-element units 3 and the light-guiding plate 1 can be prevented as compared with a light emitting module which includes a light-guiding plate in combination with light emitting elements arranged on their circuit boards. Also, in the light emitting module 100, since each of the recessed parts 1b of the light-guiding plate 1 accommodates the light-emitting-element unit 3 which is integrally constructed of the light emitting element 11 and the wavelength conversion portion 12, both the wavelength conversion portion 12 and the light emitting element 11 can be precisely arranged at their positions on the light-guiding plate 1. Therefore, good optical properties can be provided. In particular, in this embodiment, light from the light emitting elements 11 passes through the wavelength conversion portions 12, and is guided into the light-guiding plate 1 and then emitted outward. According to the light emitting module 100, the light emitting elements 11, the wavelength conversion portions 12, and the light-guiding plate 1 can be precisely arranged without deviation. Therefore, this light emitting module can provide excellent light emission properties such as low color unevenness, low luminance unevenness, and the like of light emitted outward from the light-guiding plate 1.

In the case of direct-backlight type liquid crystal display devices, since the distance between their liquid crystal panel and light emitting modules is small, the color unevenness and luminance unevenness of the light emitting modules may affect the color unevenness and luminance unevenness of the liquid crystal display devices. For this reason, such light emitting modules used in direct-backlight type liquid crystal display devices are required to have low color unevenness and luminance unevenness.

According to the construction of the light emitting module 100 of this embodiment, the color unevenness and luminance unevenness can be reduced although thickness of the light emitting module 100 are thin, for example, not greater than 5 mm, 3 mm, or 1 mm.

The components and production method of the light emitting module 100 according to this embodiment are now described in more detail.

(Specific Construction of Light-Guiding Plate 1)

Figure 18:
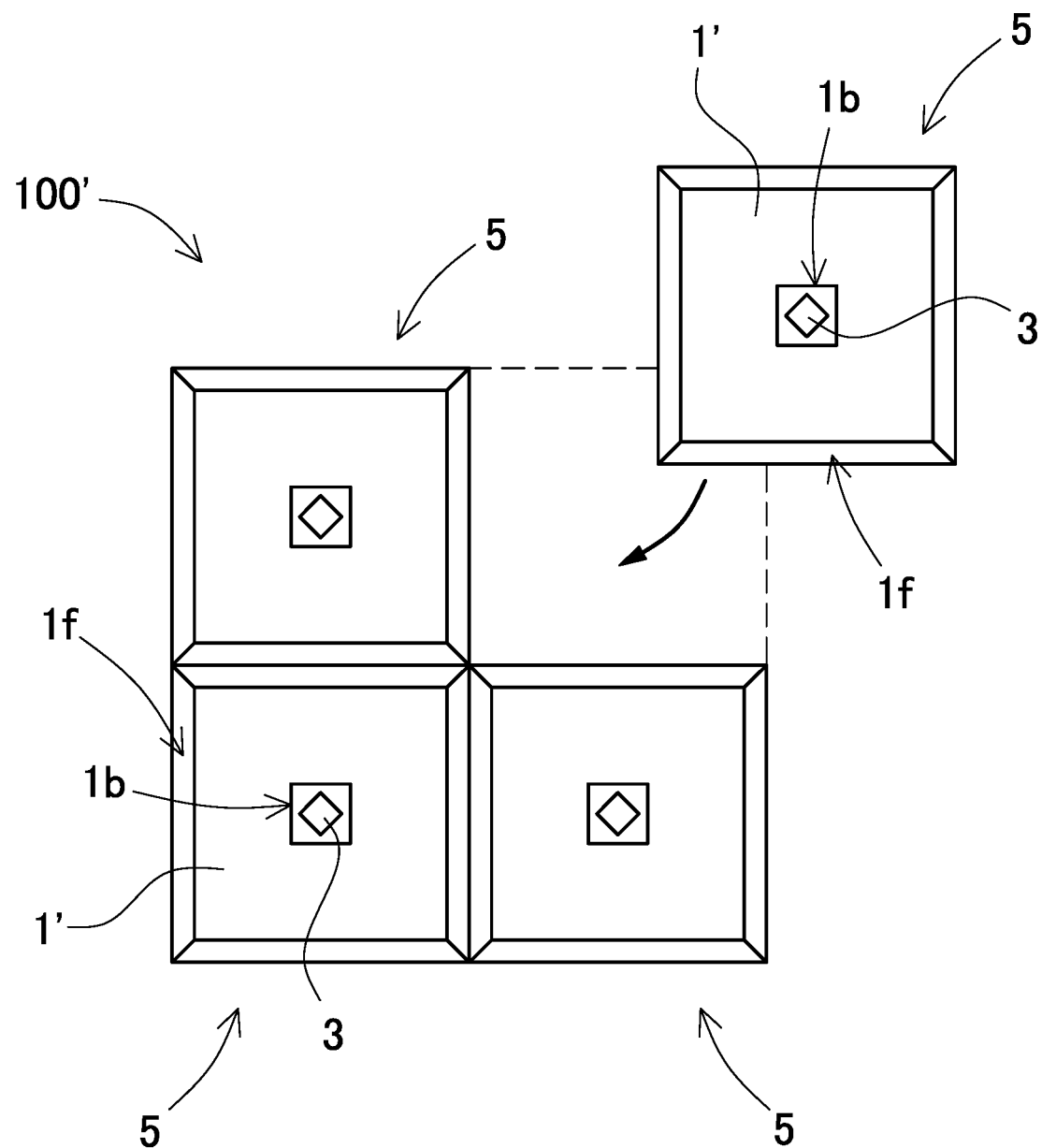
FIG. 18 is a bottom view schematically showing a light emitting module according to a modified embodiment of the present disclosure.

The light-guiding plate 1 is a light-transmissive member for emitting light from the light sources uniformly in the plane parallel to the screen. The light-guiding plate 1 according to this embodiment has the first main surface 1c as the light emitting surface, and the second main surface 1d opposed to the first main surface 1c as shown in FIG. 4. The light-guiding plate 1 has the recessed parts 1b on the second main-surface 1d. V-shaped slots 1e are formed between the recessed parts 1b adjacent to each other. The light-emitting-element unit 3 is partially accommodated in the recessed part 1b. Since the light emitting element 11 is partially accommodated in the recessed part 1b of the light-guiding plate 1, the light emitting module can be entirely thin. In the light emitting module 100, the light-guiding plate 1 includes the light-emitting-element units 3 which are accommodated in the recessed parts 1b as shown in FIGS. 4 and 17. Alternatively, in the light-emitting-module 100', the light emitting bits 5 are constructed each of which includes one light-emitting-element unit 3 and one light-guiding plate 1' having one recessed part 1b as shown in FIG. 18. The light emitting bits 5 are arranged in a matrix arrangement. The V-shaped slots 1e are formed between the recessed parts 1b in a grid shape on the light-guiding plate 1 which has the recessed parts 1b as shown in FIG. 17. The light-guiding plate 1' which has one recessed part 1b has inclined surfaces 1f on all the peripheral sides of the second main-surface 1d as shown in FIG. 18. The inclined surfaces 1f are inclined toward the edges of the light-guiding plate 1'.

The sealing resin portion 15 discussed later which reflects light is formed on the V-shaped slots 1e or the inclined surfaces 1f. The sealing resin portion 15 which fills the V-shaped grooves 1e is preferably formed of a white resin which reflects light. The sealing resin portion 15 of a white resin prevents light that travels in one part of the light-guiding plate 1 from entering a neighboring part that is separated from the one part by the V-shaped groove 1e. That is, leakage of light from one light emitting element 11 can be prevented from one part of the light-guiding plate 1 to another part. The sealing resin portion 15 which covers the inclined surfaces 1f located on the peripheral sides of the second main-surface 1d prevents leakage of light from one light-guiding plate 1' to another light-guiding plate 1'. As a result, intensity reduction of light emitted from the first main surface 1c of the light-guiding plate 1' can be prevented.

The size of the light-guiding plate 1 can be suitably dimensioned depending on the number of the recessed parts 1b. For example, in the case of the light-guiding plate 1 which has a number of recessed parts 1b, one side can be from approximately 1 to 200 cm, preferably from approximately 3 to 30 cm. The thickness of the light-guiding plate can be from approximately 0.1 to 5 mm, preferably from approximately 0.5 to 3 mm. The light-guiding plate 1 can have a roughly rectangular or circular shape as viewed in plan view, for example.

Exemplary materials of the light-guiding plate 1 can be provided by transparent materials including resin materials, such as thermoplastic resins (e.g., acrylic resin, polycarbonate, cyclic polyolefin, polyethylene terephthalate and polyester resin) and thermosetting resins (e.g., epoxy resin and silicone), glass, and the like. In particular, thermoplastic resin materials can be preferably used, since the light-guiding plate can be efficiently produced from such thermoplastic resin materials. Among them, polycarbonate is preferably used, since it has high transparency and is inexpensive. Even a low heat-resistant thermoplastic material such as polycarbonate can be used for the light emitting module which is produced without subjected to a high-temperature environment (e.g., reflow soldering) in the production processes.

The light-guiding plate 1 may be formed by ejection molding or transfer molding, for example. The light-guiding plate 1 can be formed by a die for forming a shape having the recessed portion 1b. In this case, the light-guiding plates can be inexpensively mass-produced while reducing misalignment of the recessed parts 1b. It is noted that the recessed parts can be formed by cutting by using an NC processing machine after the light-guiding plate is formed into a certain plate shape.

The light-guiding plate 1 according to this embodiment can be formed of a single layer or a plurality of light-transmissive layers. In the case where light-guiding plate is formed of a plurality of light-transmissive layers, a different refractive index layer such as air layer is preferably formed between any two layers. This arrangement enhances diffusion of light. As a result, the light emitting module can have reduced luminance unevenness. This arrangement can be provided by arranging a spacer between any two light-transmissive layers whereby forming space between them to form a layer of air, for example. Also, a light-transmissive layer may be arranged above the first main surface 1c of the light-guiding plate 1 so that a different refractive index layer such as air layer is formed between the first main surface 1c of the light-guiding plate 1 and this light-transmissive layer. This arrangement enhances diffusion of light. As a result, the liquid crystal display device can have reduced luminance unevenness. This arrangement can be provided by arranging a spacer between the light-guiding plate 1 and the light-transmissive layer whereby forming space between them to form a layer of air, for example.

(Optically Functional Part 1a)

The light-guiding plate 1 may have optically functional parts 1a on the first main surface 1c side. The optically functional part 1a can serve to diffuse light in the light-guiding plate 1 in the screen plane, for example. For example, the optically functional part 1a is formed of a material having a refractive index different from the light-guiding plate 1. Specifically, the optically functional part 1a is a recessed part which is formed on the first main surface 1c side, and has an inverted truncated cone or prismoid, or an inverted cone or an inverted pyramid (e.g., quadrilateral or hexagonal pyramid). The optically functional part 1a is formed of a material having a refractive index different from the light-guiding plate 1 (e.g., air). The optically functional part 1a can serve to reflect light in the lateral directions away from the light-emitting-element units 3 at the boundary between the different refractive index material and the inclined surface of the recessed part. Also, the optically functional part 1a may be formed of a light-reflective material (e.g, reflecting film of metal or the like, or a white resin) attached on the inclined surfaces of the recessed part 1b. The inclined surface of the optically functional part 1a may have a straight line or a curved line as viewed in cross-section. The optically functional parts 1a preferably correspond to the light-emitting-element units 3, in other words, are preferably arranged at the positions opposed to the light-emitting-element units 3 which are arranged on the second main surface 1d side as discussed later. In particular, the optical axes of the light-emitting-element units 3 preferably substantially agree with the optical axes of the optically functional parts 1a. The optically functional part 1a can be suitably dimensioned.

(Recessed Part 1b)

The light-guiding plate 1 has the recessed parts 1b which are formed on the second main-surface 1d side. The light-emitting-element units 3 are partially accommodated and are arranged in place in the recessed parts 1b. The recessed part 1b shown in FIG. 17 is formed in a shape which is obtained by cutting a part of the second main surface 1d. Although not illustrated, the recessed part may be formed by an annular protrusion which is arranged on the second main surface so that the recessed part is formed inside the annular protrusion. The interior shape of the recessed part 1b is larger than the exterior shape of an insertion part 17 of the light-emitting-element unit 3 which is accommodated in the recessed part 1b. When the insertion part 17 of the light-emitting-element units 3 is inserted into the recessed part 1b, a ring-shaped part 18 is formed between the inner periphery of the recessed part 1b and the outer periphery of the insertion part 17 of the light-emitting-element unit 3. A bonding agent 14 is applied to the ring-shaped part 18, and serves as a connection wall 19. The recessed part 1b has an interior shape which provides the ring-shaped part 18 with a volume greater than the volume of the insertion part 17 of the light-emitting-element unit 3. The light emitting module 100 according to this embodiment includes the light adjustment portions 10 which are accommodated in the recessed parts 1b of the light-guiding plate 1 so that the light adjustment portions 10 serve as the insertion parts 17 of the light-emitting-element units 3. It is noted that the insertion part 17 of the light-emitting-element unit 3 is not limited to the light adjustment portion 10. For example, the light adjustment portion 10 and a part of the light emitting element 11 in the recessed part 1b may serve as the insertion part 17.

(Light-Emitting-Element Unit 3)

The light-emitting-element units 3 serve as the light sources of the light emitting module 100. In the light-emitting-element unit 3A, the light emitting element 11 is fixed onto the light adjustment portion 10, which includes the laminated light diffusion portion and wavelength converting portion 12, as shown in FIG. 17. The outer peripheral surfaces of the light-emitting-element units 3A according to this embodiment are coplanar with the outer peripheral surfaces of the light adjustment portions 10. The light-emitting-element unit 3A includes the first sealing resin portion 15A in which the light emitting element 11 is embedded. The light-emitting-element units 3A are held in the recessed parts 1b of the light-guiding plate 1, and emit light outward through the light-guiding plate 1. Specifically, the illustrated light-emitting-element unit 3A is held in the recessed part 1b by the light adjustment portion 10 which is accommodated in the recessed part 1b of the light-guiding plate 1 and serves as the insertion part 17. The light-emitting-element unit 3A is fixed into the recessed part 1b which is formed on the light-guiding plate 1 by bonding the light adjustment portion 10 onto the bottom surface of the recessed part 1b.

The light adjustment portion 10 of the light-emitting-element unit 3A shown in FIG. 17 is bonded onto the light emitting surface 11c of the light emitting element 11. The surface of the light emitting element 11 opposed to an electrode formation surface 11d serves as the light emitting surface 11c. The light adjustment portion 10 is bonded to the light emitting surface 11c. It is noted that although the light emitting module 100 according to this embodiment includes face-down type light emitting elements which have the surface of the light emitting element 11 opposed to the electrode formation surface 11d serving as the light emitting surface 11c for functioning as the main light emitting surface, face-up type light emitting elements can be also used. The surface of the light emitting element 11 shown in FIG. 17 opposed to the light emitting surface 11c serves as the electrode formation surface 11d. A pair of electrodes 11b are formed on the electrode formation surface 11d. The pair of electrodes 11b are electrically connected to the wiring board as discussed later. The light-emitting-element unit 3A and the light-guiding plate 1 are fixed by the light-transmissive bonding agent 14 such as a light-transmissive resin or the like.

The light emitting element 11 includes a light-transmissive substrate such as sapphire, and a laminated semiconductor structure that is deposited on the light-transmissive substrate, for example. The laminated semiconductor structure includes a light-emitting layer, and n-type and p-type semiconductor layers. The light-emitting layer is interposed between the n-type and p-type semiconductor layers. N-side and p-side electrodes 11b are electrically connected to the n-type and p-type semiconductor layers, respectively. In the light emitting element 11, the light emitting surface 11c which can be the surface of the light-transmissive substrate is opposed to the light-guiding plate 1, for example. The pair of electrodes 11b are formed on the electrode formation surface 11d opposed to the light emitting surface 11c.

Although the dimensions including length, width, and height of the light emitting element 11 are not specifically limited, the semiconductor light emitting element 11 preferably has length and width of not greater than 1000 μm as viewed in plan view. The light emitting element 11 more preferably has length and width not greater than 500 μm, still more preferably not greater than 200 μm. In the case where the light emitting element 11 has dimensions falling within these ranges, the display 1000 can realize high definition images by local dimming. In particular, in the case where the light emitting elements 11 have length and width not greater than 500 μm, the light emitting elements 11 can be inexpensively purchased. Therefore, the light emitting module 100 can be inexpensively produced. In the case where the light emitting elements 11 have length and width not greater than 250 μm, the area of the upper surface of the light emitting element 11 is too small. As a result, the amount of light emitted from the side surfaces of the light emitting element 11 will relatively increase. That is, this light emitting element 11 is likely to emit light in a batwing shape. For this reason, this light emitting element is suitably used for the light emitting module 100 which has a very short dimension between the light emitting element 11 and the light-guiding plate 1 when the light emitting element 11 is bonded to the light-guiding plate 1.

The light-guiding plate 1 can include the optically functional part 1a which serves as a lens for light reflection and diffusion. This light-guiding plate 1 can diffuse light from the light emitting element 11 in the lateral directions whereby uniformly distributing light emission intensity in the plane of the light-guiding plate 1. However, in the case where the light-guiding plate 1 includes a number of optically functional parts 1a which are formed at the positions corresponding to a number of light emitting elements 11, it may be difficult to precisely arrange all the light emitting elements 11 at the positions corresponding to the optically functional parts 1a. In particular, in the case where a large number of small light emitting elements 11 are included, it will be difficult to precisely arrange all the light emitting elements 11 at the positions corresponding to the optically functional parts 1a. If the light emitting element 11 is misaligned with the optically functional part 1a, the optically functional part 1a cannot sufficiently diffuse light. Such misalignment may cause partial brightness reduction in the screen plane. As a result, a problem of luminance unevenness will arise. In particular, in the case where the light-guiding plate 1 is fixed onto the light emitting elements 11 after the light emitting elements 11 are mounted on the wiring board, it is necessary to consider misalignment between the wiring board and the light emitting elements 11, and misalignment between the light emitting elements 11 and the optically functional parts 1a of the light-guiding plate 1 in the screen plane and the lamination direction. For this reason, it may be much more difficult to optically properly connect the light emitting elements 11 to the optically functional parts 1a.

According to the light emitting module 100 of this embodiment which includes the recessed parts 1b and the optically functional parts 1a formed on the light-guiding plate 1, both the light emitting elements 11 and the optically functional parts 1a can be precisely at their positions by the structure that accommodates the light-emitting-element units 3 in the recessed parts 1b. This structure allows the optically functional parts 1a to accurately uniformly distribute light from the light emitting elements 11. Therefore, a high quality light source for backlights can be provided which has low color unevenness and luminance unevenness.

According to the light-guiding plate 1 which includes the optically functional parts 1a formed on the surface opposite to the recessed parts 1b for accommodating the light emitting elements 11, since the optically functional parts 1a are formed at the positions of the recessed parts 1b for accommodating the light emitting elements 11 as viewed in perspective plan view, the light emitting elements 11 and the optically functional parts 1a can be easily positioned so that they both can be highly precisely aligned with each other.

The light emitting element 11 has a rectangular shape such as square or rectangular shape as viewed in plan view. The light emitting elements 11 to be used for high definition displays preferably has a rectangular shape. Accordingly, their upper surface has longer and shorter sides. In a high definition display, the number of the light emitting elements to be used is thousands or more. The process for mounting the light emitting elements is important. Even if rotational deviation (e.g., ±90 degrees deviation) occurs to some of the light emitting elements in the process for mounting the light emitting elements, such rectangular light emitting elements as viewed in plan view make visual inspection easy. In addition, since the p-side and n-side electrodes can be spaced at a certain distance away from each other, wiring 21 discussed later can be easily formed. Contrary to this, in the case where light emitting elements 11 having a square shape as viewed in plan view are used, small light emitting elements 11 can be efficiently produced in volume. The density (pitch) of the light emitting elements 11, that is, the distance between the light emitting elements 11 can be approximately from 0.05 to 20 mm, preferably approximately from 1 to 10 mm, for example.

In the light emitting module 100A which includes a number of light-emitting-element units 3 arranged on the light-guiding plate 1 having a number of recessed parts 1b, the light-emitting-element units 3 are arranged in a two-dimensional arrangement (in rows and columns) as viewed in the plan view of the light-guiding plate 1. Preferably, the light-emitting-element units 3 are arranged in the recessed parts 1b which are arranged in a two-dimensional arrangement extending along two perpendicularly-intersecting directions (i.e., x and y directions) as shown in FIG. 4. The pitches $p_x$ and $p_y$ which correspond to the x and y directions, respectively, of the recessed parts 1b for accommodating the light-emitting-element units 3 can be the same as each other as shown in the embodiment of FIG. 4. Alternatively, the pitches corresponding to the x and y directions may be different from each other. The two directions of the two-dimensional arrangement are not necessarily to perpendicularly intersect each other. The pitches corresponding to the x and y directions are not limited to a fixed value, and may vary. For example, the pitches between the recessed parts 1b which accommodate the light-emitting-element units 3 may increase from the center to the peripheral edges of the light-guiding plate 1. The pitch between the light-emitting-element units 3 which are accommodated in the recessed parts 1b refers to the distance between the optical axes of the light-emitting-element units 3, i.e., the center-to-center distance.

Well-known semiconductor light emitting elements can be used as the light emitting elements 11. In this embodiment, the face-down type light emitting diodes are illustratively used as the light emitting elements 11. The light emitting elements 11 emit blue light, for example. Elements which emit light other than blue can be also used as the light emitting elements 11. Also, face-up type light emitting elements can be used. Also, two or more light emitting elements which emit light with different colors can be used as the light emitting elements 11. The color of light emitted from the light emitting element 11 is adjusted to a desired color to be emitted outward by the wavelength conversion portion 12.

Elements which emit light having any wavelength can be selectively used as the light emitting elements 11. For example, light emitting elements which are formed of nitride group semiconductors ($In_xAl_yGa_{1-x-y}N$, $0 \le x$, $0 \le y$, $x+y \le 1$) or GaP can be used as an element which emits blue or green light. Light emitting elements which are formed of semiconductors such as GaAlAs and AlInGaP can be used as an element which emits red light. Semiconductor light emitting devices can also be used which are formed of materials other than these materials. Various light wavelengths can be provided by selecting materials and mixed crystal ratios of semiconductor layer. The composition, the light color, the size, the number, and the like of the light emitting elements to be used can be suitably selected depending on the purpose.

(Light Adjustment Portion 10)

The light-emitting-element unit 3A according to this embodiment includes the light adjustment portion 10 which adjusts the color of light emitted from the light emitting element 11 so that the adjusted light enters the light-guiding plate 1. The light adjustment portion 10 includes the wavelength conversion portion 12 which adjusts the color of light emitted from the light emitting element 11, and the light diffusion portion 13 which is laminated on the wavelength conversion portion 12 and diffuses the adjusted light. The wavelength conversion portion 12 is bonded to the light emitting surface 11c of the light emitting element 11, and adjusts the color of light emitted by the light emitting element 11. The light diffusion portion 13 diffuses light emitted by the light emitting element 11 so that the diffused light enters the light-guiding plate 1. In the light adjustment portion 10 which includes the wavelength conversion portion 12 bonded to the light diffusion portion 13, the wavelength conversion portion 12 is arranged on the light-emitting-element 11 side, while the light diffusion portion 13 is arranged on the bottom surface side of the recessed part 1b. The light adjustment portion 10 may include two or more wavelength conversion portions 12 and two or more light diffusion portions 13 which are laminated on one after another. The light emitting module 100A according to this embodiment includes the light adjustment portions 10 which are accommodated in the recessed parts 1b of the light-guiding plate 1 so that the light adjustment portions 10 serve as the insertion parts 17 of the light-emitting-element units 3A. Light from the light emitting element 11 passes through the light adjustment portion 10, and enters the light-guiding plate 1. In order to slim the light emitting module 100A, the light adjustment portions 10 are preferably accommodated in the recessed parts 1b of the light-guiding plate 1 without protruding from the second main surface 1d toward the surface side as shown in FIG. 17. The light adjustment portion 10 shown in FIG. 17 has the same thickness as the depth of the recessed part 1b so that the surface of the light adjustment portion 10 is coplanar with the second main surface 1d. Thus, in the light emitting module 100A, the light adjustment portion 10 is arranged inside the recessed part 1b, while the light emitting element 11 is arranged outside the recessed part 1b. Although not illustrated, the light adjustment portion can have a thickness that slightly protrudes the light adjustment portion from the second main surface of the light-guiding plate when accommodated in the recessed part.

The light adjustment portion 10 of the light-emitting-element unit 3 shown in FIG. 17 has an outline greater than the outline of the light emitting element 11. According to this light-emitting-element unit 3, all the light which outgoes from the light emitting surface 11c of the light emitting element 11 can pass through the light adjustment portion 10, and then enter the light-guiding plate 1. Therefore, color unevenness can be reduced.

The wavelength conversion portion 12 includes a wavelength conversion material added to its base material. The light diffusion portion 13 includes a filler material added to its base material. Exemplary materials of the base material can be provided by light-transmissive materials such as epoxy resin, silicone resin, mixed resin of these resins, glass, and the like. Silicone resin is advantageously used as the base material of the light adjustment portion 10 from the viewpoint of light resistance and ease of formation. A material which has a refractive index higher than the material of the light-guiding plate 1 is preferably used as the base material of the light adjustment portion 10.

Exemplary materials of the wavelength conversion material which is included by the wavelength conversion portion 12 can be provided YAG phosphor, β-SIALON phosphor, fluoride phosphor such as KSF phosphor, and the like. In particular, in the case where two or more types of wavelength conversion materials are used in one wavelength conversion portion 12, more preferably, in the case where the wavelength conversion portion 12 includes a β-SIALON phosphor which emits green-range light and a fluoride phosphor (e.g., KSF phosphor) which emits red-range light, the light emitting module can have a wider color reproduction range. In this case, the light emitting element 11 preferably include a nitride semiconductor ($In_xAl_yGa_{1-x-y}N$, $0 \leq x$, $0 \leq y$, $x+y \leq 1$) which can emit light in the short wavelength range capable of efficiently exciting the wavelength conversion materials. In the case where the light emitting element 11 is used which emits blue range light, for example, the wavelength conversion portion 12 includes not smaller than 60%, preferably 90% by weight of KSF phosphor (red phosphor) so that red range light can be sufficiently emitted. That is, in order to provide particular color light, the wavelength conversion portion 12 can include a wavelength conversion material which emits particular color light. The wavelength conversion material may be quantum dots. The wavelength conversion material may be included in any arrangement in the wavelength conversion portion 12. For example, the wavelength conversion material may be substantially uniformly or unevenly distributed. Two or more layers may be laminated on one after another which include different wavelength conversion materials.

The light diffusion portion 13 includes white powder which is added to and distributed in the aforementioned resin material as its base material, for example. Inorganic particles such as $SiO_2$ or $TiO_2$ are preferably used as white powder.

(Sealing Resin Portion 15)

The sealing resin portion 15 is fixed onto the second main-surface 1d of the light-guiding plate 1 of the light emitting module 100 shown in FIG. 17. Preferably, the sealing resin portion 15 is a white resin which is formed of a transparent resin added with white powder or the like as additive for reflecting light. The sealing resin portion 15 formed of a white resin reflects light that travels from the outer peripheral part and the electrode surfaces of the light emitting element 11, light that travels from the back surface of the light adjustment portion 10, light that travels from the back surface of the connection wall 19, and light that travels from the second main surface 1d of the light-guiding plate 1. As a result, the light which is emitted from the light emitting element 11 can be effectively emitted outward from the first main surface 1c of the light-guiding plate 1. The sealing resin portion 15 of the light emitting module 100 shown in FIG. 17 includes the first and second sealing resin portions 15A and 15B. Although the sealing resin portion 15 of this illustrated light emitting module 100 is constructed of the first sealing resin portion 15A which is integrally constructed with the light-emitting-element unit 3, and the second sealing resin portion 15B which is fixed onto the second main surface 1d of the light-guiding plate 1, the sealing resin portion may be composed not of the separated first and second sealing resin portions but of a single portion. This light emitting module 100 can be produced by bonding the single sealing resin portion to the second main surface of the light-guiding plate, after fastening the light-emitting-element unit which does not include the first sealing resin portion to the light-guiding plate.

The light emitting module 100 which includes the separated first and second sealing resin portions 15A and 15B can be produced by fastening the first sealing resin portion 15A onto the light emitting element 11 and the light adjustment portion 10 whereby forming an integral structure block constructed of the first sealing resin portion 15A integrally with the light emitting element 11 and the light adjustment portion 10 in the process for manufacturing the light emitting module 100. After the light-emitting-element unit 3 which includes the first sealing resin portion 15A is bonded to the light-guiding plate 1, the space between the first sealing resin portions 15A is filled with the second sealing resin portion 15B so that the second sealing resin portion 15B is fixed onto the second main surface 1d of the light-guiding plate 1.

The separated first and second sealing resin portions 15A and 15B are tightly fixed onto each other. Also, the first sealing resin portion 15A is tightly fixed onto the light emitting element 11. The first sealing resin portion 15A is arranged around the light emitting elements 11 so that the light emitting elements 11 are embedded in the first sealing resin portion 15A but the electrodes 11b of the light emitting elements 11 are exposed from the surface of the first sealing resin portion 15A. The outer peripheral surfaces of the first sealing resin portion 15A are coplanar with the outer peripheral surfaces of the light adjustment portion 10. The first sealing resin portion 15A is also tightly fixed onto the light adjustment portion 10. The first sealing resin portion 15A is produced as a part of the light-emitting-element unit 3 whereby forming an integral structure together with the light emitting element 11 and the light adjustment portion 10. After that, the light-emitting-element unit 3 formed of the integral structure is fixed onto the light-guiding plate 1. The first sealing resin portion 15A is preferably formed of a white resin. This first sealing resin portion 15A reflects light that is emitted from the outer peripheral surfaces of the light emitting element 11. As a result, the light emission efficiency of the light emitting module 100 can be increased. The second sealing resin portion 15B is tightly fixed onto the second main surface 1d of the light-guiding plate 1, and the back surfaces of the connection walls 19. The second sealing resin portion 15B is coplanar with the surface from which the electrodes 11b of the first sealing resin portion 15A are exposed. After the light-emitting-element unit 3 which includes the integral structure including the first sealing resin portion 15A is bonded to the light-guiding plate 1, the second sealing resin portion 15B is fixed onto the second main surface 1d of the light-guiding plate 1 whereby occupying the space between the first sealing resin portions 15A.

The second sealing resin portion 15B is laminated on the light-guiding plate 1, and reinforces the light-guiding plate 1. The second sealing resin portion 15B is preferably formed of a white resin. This sealing resin portion 15 efficiently directs light which is emitted from the light emitting element 11 toward the light-guiding plate 1. As a result, the light emission output through the first main surface 1c of the light-guiding plate 1 can be increased. The second sealing resin portion 15B formed of a white resin serves both as a member for protecting the light emitting element 11, and a layer for reflecting light at the boundary surface between the second sealing resin portion 15B and the second main surface 1d of the light-guiding plate 1. Therefore, the light emitting module 100 can be thin.

Suitable materials for the sealing resin portion 15 are white resins which have a reflectance of not less than 60%, preferably not less than 90% of the light emitted from the light emitting element 11. The sealing resin portion 15 is preferably formed of a resin which includes white pigments such as white powder. In particular, silicone resin is suitably used which includes inorganic white powder such as titanium oxide. According to this sealing resin portion, inexpensive raw materials including titanium oxide are used as a relatively large amount of material to cover one surface of the light-guiding plate 1. Therefore, the light emitting module 100 can be inexpensively formed.

(Light-Transmissive Bonding Material)

In the light emitting module 100 shown in FIG. 17, a light-transmissive bonding material bonds the wavelength conversion portion 12 to the light diffusion portion 13, the light adjustment portion 10 to the light emitting element 11, and the light-emitting-element unit 3 to the light-guiding plate 1. The light adjustment portion 10 is formed by bonding the wavelength conversion portion 12 to the light diffusion portion 13 by the light-transmissive bonding material. The light-emitting-element unit 3 is formed by bonding the light adjustment portion 10 to the light emitting element 11 by the light-transmissive bonding material. The light-emitting-element unit 3 is fastened to the light-guiding plate 1 by a light-transmissive bonding member 16 which is formed from the bonding agent 14 for bonding the light-emitting-element unit 3 onto the bottom surface of the recessed part 1b of the light-guiding plate 1. The light adjustment portion 10 is bonded onto the interior surface of the recessed part 1b by the light-transmissive bonding member 16 which is formed from the bonding agent 14 and serves as the connection wall 19. The ring-shaped part 18 between the recessed part 1b and the insertion portion 17 of the light-emitting-element unit 3 is filled with the bonding agent 14.

The light-transmissive bonding member has transmittance not smaller than 60%, preferably not smaller than 90%. Light which is emitted from the light emitting element 11 travels into the light-guiding plate 1 through the light-transmissive bonding member 16. Although the light-transmissive bonding member 16 can include a filler material or the like, or white powder or the like as additives for reflecting light, the light-transmissive bonding member may be formed of only the light-transmissive resin material which contains neither such a filler material nor white powder.

Exemplary materials of the light-transmissive bonding member can be provided by light-transmissive thermosetting resin materials such as epoxy resin, silicone resin, and the like.

In the light emitting module 100 according to the foregoing embodiments, the light-emitting-element units 3 may be wired to be driven independently from each other. The light-guiding plate 1 may have two or more areas. In this case, the light-emitting-element units 3 are grouped into two or more groups to which the light-emitting-element units 3 belong. The light-emitting-element units 3 that belong to one group are electrically connected in series or in parallel to each other so that they are connected to their common circuit. Thus, two or more groups of light-emitting-element units can be provided. Such grouping allows the light emitting module to provide local dimming.

One light emitting module 100 according to the foregoing embodiments may be used as a backlight of one liquid crystal display device. Also, a number of light emitting modules 100 can be arranged side by side, and used as a backlight of one display 1000. In the case where a number of small light emitting modules 100 are produced and inspected for defects, their yield can be improved as compared with the case where large light emitting modules 100 which include a larger number of light emitting elements 11 are produced.

Also, an additional light-transmissive member which has a diffusion function and the like may be additionally laminated on the light-guiding plate 1. In this case, when the optically functional parts 1a are recessed parts, the opening (the part near the first main surface 1c of the light-guiding plate 1) of the recessed parts will be closed. It is preferable that the recessed parts are not filled with the additional light-transmissive member. The reason is that an air layer can be formed in the recessed part as the optically functional part 1a so that light from the light emitting element 11 can be widely distributed.

The light emitting module according to the present invention can be used as a backlight for liquid crystal display devices, a lighting device, and the like, for example.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting device comprising:
    a plurality of light emitting modules, comprising:
        a plurality of light emitting elements, and
        anode-side and cathode-side terminals that are arranged on a back surface of said plurality of light emitting modules and are connected to said plurality of light emitting elements, and are connected to each other in series or in parallel, in order to supply currents to said plurality of light emitting elements;
    a frame that holds said plurality of light emitting modules in a matrix arrangement on a common plane to provide a light emitting screen; and
    a flexible wiring board that electrically connects said plurality of light emitting modules to each other, and has a comb shape that includes a plurality of comb-tooth portions extending in a row or column direction of the matrix arrangement of said plurality of light emitting modules and including an electrically-conductive pattern to which the anode-side and cathode-side terminals of said plurality of light emitting modules are connected, wherein said light emitting modules further include a light-transmissive light-guiding plate in which said plurality of light emitting elements are arranged, wherein said light-guiding plate includes
a first main surface that serves as a light emission surface through which light exits, and
a second main surface opposite to said first main surface, wherein said light-guiding plate includes a plurality of recessed parts in said second main surface, wherein a light emitting surface of said light emitting element faces its corresponding recessed part, and wherein said wiring board includes the plurality of comb-tooth portions and a plurality of slit parts between neighboring comb-tooth portions respectively, each of the slit parts penetrating said wiring board, wherein said light emitting modules have a rectangular outline as viewed in a plan view, wherein said anode-side and cathode-side terminals are arranged along two opposite sides of said rectangular outline, and wherein the comb-tooth portions extend along the light emitting modules to pass through the anode-side and cathode-side terminals.

2. The light emitting device according to claim 1, wherein said comb-tooth portions pass through parts of transverse sides of said light emitting modules which are transverse to the extension lines of said comb-tooth portions.

3. The light emitting device according to claim 1, wherein a width of said comb-tooth portions is smaller than half a width of said light emitting modules.

4. The light emitting device according to claim 1, further comprising a driving circuit that controls a driven level of said plurality of light emitting modules,
wherein said wiring board includes a circuit connection portion that connects ends of said plurality of comb-tooth portions on one side of the comb shape to each other, and is connected to said driving circuit.

5. The light emitting device according to claim 1, wherein said plurality of light emitting elements are arranged in a matrix arrangement on their light emitting module.

6. The light emitting device according to claim 1, wherein said wiring board is formed of FPC.

7. The light emitting device according to claim 1, further comprising a wavelength conversion member located on or above a light emitting surface of said plurality of light emitting elements.

8. The light emitting device according to claim 1, wherein said plurality of light emitting elements include a light-transmissive member that covers a main light emitting surface of at least one of said plurality of light emitting elements, and a first light-reflective member that covers one or more side surfaces of at least one of said plurality of light emitting elements.

9. The light emitting device according to claim 1 further comprising a liquid crystal panel that is arranged over said light emitting screen, and
a panel member that is interposed between said light emitting screen and said liquid crystal panel.

10. A light emitting device comprising:
a plurality of light emitting modules that include a plurality of light emitting elements;
a frame that holds said plurality of light emitting modules in a matrix arrangement on a common plane to provide a light emitting screen;
a flexible wiring board that includes a plurality of slit parts extending in a row or column direction of the matrix arrangement of said plurality of light emitting modules, each of the slit parts penetrating said wiring board, and electrically connects said plurality of light emitting modules to each other; and
heat-dissipating plates or parts of a heat-dissipating plate are arranged in said plurality of slit parts,
wherein said light emitting modules further include a light-transmissive light-guiding plate in which said plurality of light emitting elements are arranged,
wherein said light-guiding plate includes
a first main surface that serves as a light emission surface through which light exits, and
a second main surface opposite to said first main surface,
wherein said light-guiding plate includes a plurality of recessed parts in said second main surface,
wherein a light emitting surface of said light emitting element faces its corresponding recessed part, and
wherein the heat-dissipating plates or parts and the wiring board are separate elements.

11. The light emitting device according to claim 10, wherein said wiring board has a comb shape that includes a plurality of comb-tooth portions, wherein said plurality of slit parts are formed between neighboring comb-tooth portions.

12. The light emitting device according to claim 10, wherein said slit parts have an open end on one side.

13. The light emitting device according to claim 10, wherein said plurality of slit parts have the same width.

14. The light emitting device according to claim 13, wherein said plurality of slit parts extend along the extension direction of said comb-tooth portions, and are substantially evenly spaced away from each other.

15. The light emitting device according to claim 10, wherein said heat-dissipating plates or parts of a heat-dissipating plate include an elongated shape extending along the corresponding slit.

16. The light emitting device according to claim 10, wherein said heat-dissipating plates have an elongated rectangular shape.

17. The light emitting device according to claim 10, wherein said heat-dissipating plates or parts of a heat-dissipating plate have a thickness substantially equal to said comb-tooth portions.

18. The light emitting device according to claim 10, wherein said heat-dissipating plates or parts of a heat-dissipating plate are formed of a metal plate.

* * * * *